US012755766B2

(12) United States Patent
Jeong et al.

(10) Patent No.: US 12,755,766 B2
(45) Date of Patent: Oct. 6, 2026

(54) CALIBRATION DEVICES AND OPERATING METHODS THEREOF

(71) Applicant: SAMSUNG ELECTRONICS CO., LTD., Suwon-si (KR)

(72) Inventors: Jichull Jeong, Suwon-si (KR); Youngwoo Park, Suwon-si (KR); Seungjin Park, Suwon-si (KR); Jindo Byun, Suwon-si (KR); Seunghoon Lee, Suwon-si (KR); Eunsang Lee, Suwon-si (KR); Chaekang Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 132 days.

(21) Appl. No.: 18/785,979

(22) Filed: Jul. 26, 2024

(65) Prior Publication Data

US 2025/0166677 A1 May 22, 2025

(30) Foreign Application Priority Data

Nov. 22, 2023 (KR) ........................ 10-2023-0163480

(51) Int. Cl.

*G11C 7/14* (2006.01)
*G11C 7/06* (2006.01)
*G11C 7/10* (2006.01)

(52) U.S. Cl.

CPC ................ *G11C 7/14* (2013.01); *G11C 7/062* (2013.01); *G11C 7/1063* (2013.01); *G11C 2207/2254* (2013.01)

(58) Field of Classification Search

CPC ............................................. G11C 2207/2254

See application file for complete search history.

(56) References Cited

U.S. PATENT DOCUMENTS 9,779,039 B2 10/2017 Grunzke
10,284,198 B2 5/2019 Lee et al.
10,891,989 B2 1/2021 Satoh et al.
11,238,909 B2 2/2022 Durai et al.
11,381,425 B2 7/2022 Yamamoto et al.
11,475,955 B2 10/2022 Lee et al.
11,495,280 B2 11/2022 Seo et al.
2016/0049180 A1* 2/2016 Tsukada ............... G11C 7/1084 365/189.05
2021/0327476 A1* 10/2021 Lee ...................... G11C 7/1087

* cited by examiner

*Primary Examiner* — Hoai V Ho

(74) *Attorney, Agent, or Firm* — Fish & Richardson P.C.

(57) ABSTRACT

Disclosed is a memory device which includes a driver unit that includes a pull-up driver and a pull-down driver, a ZQ calibration unit that performs ZQ calibration with respect to the driver unit based on an external resistor and a first reference voltage and generates a first ZQ code corresponding to the first reference voltage, and a code conversion unit that generates a second ZQ code corresponding to a second reference voltage different from the first reference voltage, based on the first ZQ code.

20 Claims, 14 Drawing Sheets

CALIBRATION DEVICES AND OPERATING METHODS THEREOF

CROSS-REFERENCE TO RELATED APPLICATION

This application claims priority under 35 U.S.C. § 119 to Korean Patent Application No. 10-2023-0163480, filed on Nov. 22, 2023, in the Korean Intellectual Property Office, the disclosure of which is incorporated by reference herein in its entirety.

BACKGROUND

As speeds of interface operations of semiconductor devices become higher, a swing width of a signal transmitted between semiconductor devices gradually decreases. As the swing width of the signal decreases, the influence of external noise may increase. Also, loss of signal may increase in the process of transmitting/receiving data between a transceiver circuit and an interface of each semiconductor device.

The signal loss between the transceiver circuit and the interface of each semiconductor device may be caused by reflected waves, as well as by external noise. Impedance matching can be used to suppress the reflected waves that may occur between the transceiver circuits and the interface. Impedance matching can be used in an interface operation between semiconductor dies. To this end, an on-die termination (ODT) technology may be used, and, for example, a ZQ calibration technology may be used.

SUMMARY

For purposes of this disclosure, it has been recognized that ZQ calibration devices and operation method thereof may have long calibration times. Some implementations of the present disclosure provide ZQ calibration devices capable of generating ZQ codes corresponding to various voltage levels while shortening a calibration time, and operation methods thereof.

According to some implementations, a memory device includes a driver unit that includes a pull-up driver and a pull-down driver, a ZQ calibration unit that performs ZQ calibration with respect to the driver unit based on an external resistor and a first reference voltage and generates a first ZQ code corresponding to the first reference voltage, and a code conversion unit that generates a second ZQ code corresponding to a second reference voltage different from the first reference voltage, based on the first ZQ code.

According to some implementations, a calibration operation method of a memory device includes performing ZQ calibration with respect to a driver unit included in a memory device based on an external resistor and a first reference voltage to generate a first ZQ code corresponding to the first reference voltage, and generating a second ZQ code corresponding to a second reference voltage different from the first reference voltage based on conversion of the first ZQ code.

According to some implementations, an electronic system includes a main processor that controls the electronic system, and a storage device that stores data. The storage device includes a calibration unit that generates a first ZQ code corresponding to a first reference voltage based on an external resistor and the first reference voltage and generates a second ZQ code corresponding to a second reference voltage based on the first ZQ code.

BRIEF DESCRIPTION OF THE DRAWINGS

The above and other objects and features of the present disclosure will become apparent by describing in detail examples thereof with reference to the accompanying drawings.

DETAILED DESCRIPTION

Below, various examples according to the present disclosure will be described in detail and clearly to such an extent that one of ordinary skill in the art can implement the present disclosure.

Figure 1:
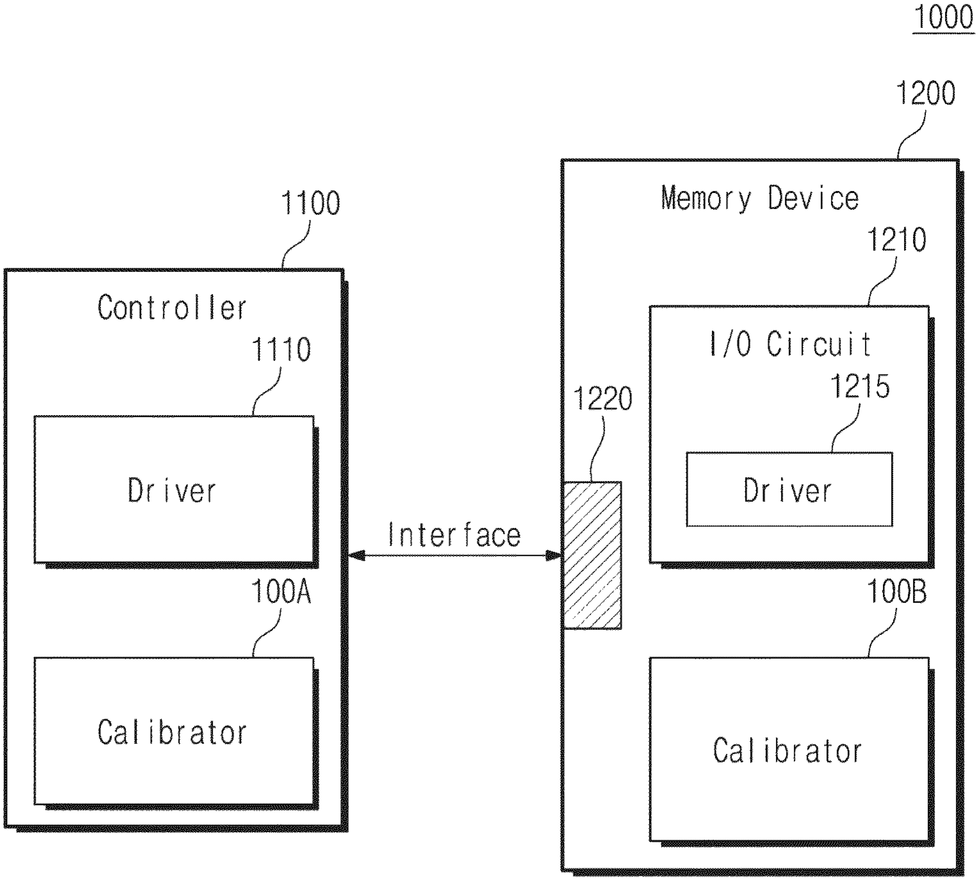
FIG. 1 is a block diagram illustrating a memory system, according to some implementations of the present disclosure.

FIG. 1 is a block diagram illustrating a memory system according to some implementations of the present disclosure. Referring to FIG. 1, a memory system 1000 may include a controller 1100 and a memory device 1200. The memory device 1200 may include an input/output (I/O) circuit 1210, an interface circuit 1220, and a calibrator 100B. The input/output circuit 1210 may control the data input/output of the memory device 1200. In some implementations, the input/output circuit 1210 may exchange data with the controller 1100 through the interface circuit 1220.

The memory system 1000 may store data, may manage the stored data, and may provide information necessary for the user. In some implementations, the memory system 1000 may be an electronic device such as a personal computer (PC), a laptop computer, a tablet PC, a personal digital assistant (PDA), or a camera. This is provided as an example, and the memory system 1000 is not limited to the above electronic devices.

The controller 1100 may control all operations of the memory system 1000. For example, the controller 1100 may schedule the operations of the memory system 1000 or may encode or decode signals/data processed in the memory system 1000. The controller 1100 may control the memory device 1200 such that the memory device 1200 stores or outputs data. In some implementations, the controller 1100 may interface with the memory device 1200. For example, the controller 1100 may perform an interface operation with the memory device 1200 in response to a command received from a host (not illustrated).

In some implementations, the controller 1100 may include a first driver 1110 and a controller calibrator (hereinafter referred to as a "first calibrator") 100A. For example, the controller 1100 may perform the interface operation with various devices (e.g., the memory device 1200) in the memory system 1000 through the first driver 1110. For example, the first calibrator 100A may provide impedance matching necessary for the interface operation of the first driver 1110.

The controller 1100 may be connected to the memory device 1200 through a plurality of channels. The controller 1100 may include a hardware or software device for performing operations in response to various requests from the host device. According to some implementations, the controller 1100 may include a volatile memory such as a dynamic random access memory (DRAM), a static random access memory (SRAM), or a synchronous DRAM (SDRAM).

The controller 1100 may include one or more hardware components (e.g., an analog circuit and a digital circuit) which perform the above functions and functions to be described later. In some implementations, the controller 1100 may include one or more processor cores. The functions of the controller 1100 may be implemented by a program code of software and/or firmware, and the processor core(s) of the controller 1100 may execute an instruction set of the program code. The processor core(s) of the controller 1100 may process various kinds of arithmetic operations and/or logic operations for the purpose of executing the instruction sets.

The memory device 1200 may include at least one or more non-volatile memories. For example, the memory device 1200 may include different kinds of non-volatile memories such as a PRAM, an FRAM, and an MRAM. In some implementations, the memory device 1200 may include a plurality of flash memories. For example, the memory device 1200 may store one data bit or two or more data bits per memory cell. For another example, the non-volatile memory constituting the memory device 1200 may include a memory cell array of a three-dimensional structure.

The interface operation between the controller 1100 and the memory device 1200 may be performed based on a digital signal or an analog signal. In some implementations, the memory device 1200 may perform the interface operation with the controller 1100 through the interface circuit 1220 included in the memory device 1200. An example in which only the memory device 1200 performs the interface operation through the interface circuit 1220 is illustrated in FIG. 1. However, it should be understood that implementations in which each of the controller 1100 and the memory device 1200 includes the interface circuit 1220, implementations in which only the controller 1100 includes the interface circuit 1220, and implementations in which the controller 1100 and the memory device 1200 do not include the interface circuit 1220 are within the scope of this disclosure.

The controller 1100 and the memory device 1200 may respectively include drivers for performing the interface operation. For example, the controller 1100 may include the first driver 1110, and the memory device 1200 may include a second driver 1215. In some implementations, the memory device 1200 may include the second driver 1215 in the input/output circuit 1210. In some implementations, the memory device 1200 may directly include the second driver 1215, or the memory device 1200 may include the second driver 1215 in the interface circuit 1220. Below, with respect to FIG. 1, a driver may indicate the first driver 1110 or the second driver 1215.

When the interface operation between the controller 1100 and the memory device 1200 is performed based on a voltage signal, a level of the voltage signal can be maintained at a specific value. For example, a voltage level or a current level of an output terminal of the driver performing the interface operation between the controller 1100 and the memory device 1200 can be maintained uniformly. When the level of the voltage signal is not maintained, the speed of the interface operation may decrease, and/or data which are output from the memory device 1200 or are input to the memory device 1200 may be lost or modified (e.g., due to the reflected wave generated during the interface operation).

The interface circuit 1220 may perform the interface operation of the memory device 1200. For example, the interface circuit 1220 may transfer a command received from the controller 1100 to a memory device controller. In some implementations, the interface circuit 1220 may write data in a plurality of memory cell arrays or may read data therefrom.

The memory device 1200 may include the second driver 1215 and the second calibrator 100B. In some implementations, the second driver 1215 may be included in the input/output circuit 1210 of the memory device 1200 and may perform the interface operation with the controller 1100. Like the first calibrator 100A, the second calibrator 100B may provide impedance matching necessary for the operation of the second driver 1215. The "calibrator 100" may refer to the first calibrator 100A or the second calibrator 100B, in various implementations.

The calibrator 100 may maintain the voltage level or the current level of the output terminal of the driver for the interface operation. In some implementations, the calibrator 100 may adjust the output impedance of the output terminal of the driver. For example, the calibrator 100 may match the impedance of the driver and the impedance of an interface channel.

Below, the calibrator 100 will be described based on an example of a ZQ calibration device. It should be understood that the present disclosure is not limited to the ZQ calibration operation, and it should be understood that the present disclosure is applicable to various calibration devices and operations. The calibrator 100 may adjust a resistance value of the driver connected to a channel for the interface operation and may maintain the voltage level or the current level for the interface operation based on the adjustment of the resistance value. Also, for convenience of description, a ZQ calibration process for the interface operation between the controller 1100 and the memory device 1200 will be described as an example, but it will be understood that the devices and operations described herein can be used in providing calibration for interface operations between a plurality of semiconductor dies.

While the memory system 1000 operates, a voltage level, a current level, or an input/output impedance magnitude of each driver may change. For example, the impedance of each driver may vary depending on process, voltage, and temperature (PVT) conditions. In this case, the level of the voltage signal or current signal used in the interface operation between the controller 1100 and the memory device 1200 may not be accurately adjusted, and data exchanged through the interface operation may be damaged due to the reflected wave or the like.

Accordingly, a calibration operation can be performed to allow the impedance of the output terminal of each driver to be maintained even though the PVT conditions vary. The calibrator 100 may perform the calibration operation. A time (e.g., ZQ long (ZQCL) of double data rate (DDR) memory) allocated to the calibration operation to be performed in the initialization process of the memory system 1000 may be relatively long; by contrast, a time for the calibration operation to be performed due to the change in the PVT conditions during the operation of the memory system 1000 or the calibration operation (e.g., ZQ short (ZQCS) of DDR memory) to be performed due to the change in the voltage level of the driver output terminal may be relatively short. Implementations described herein provide the calibrator 100 which performs the calibration operation capable of coping with various voltage levels and PVT conditions in a shorter time. Examples of calibrators providing the above functions will be described in detail with reference to the following drawings.

Figure 2:
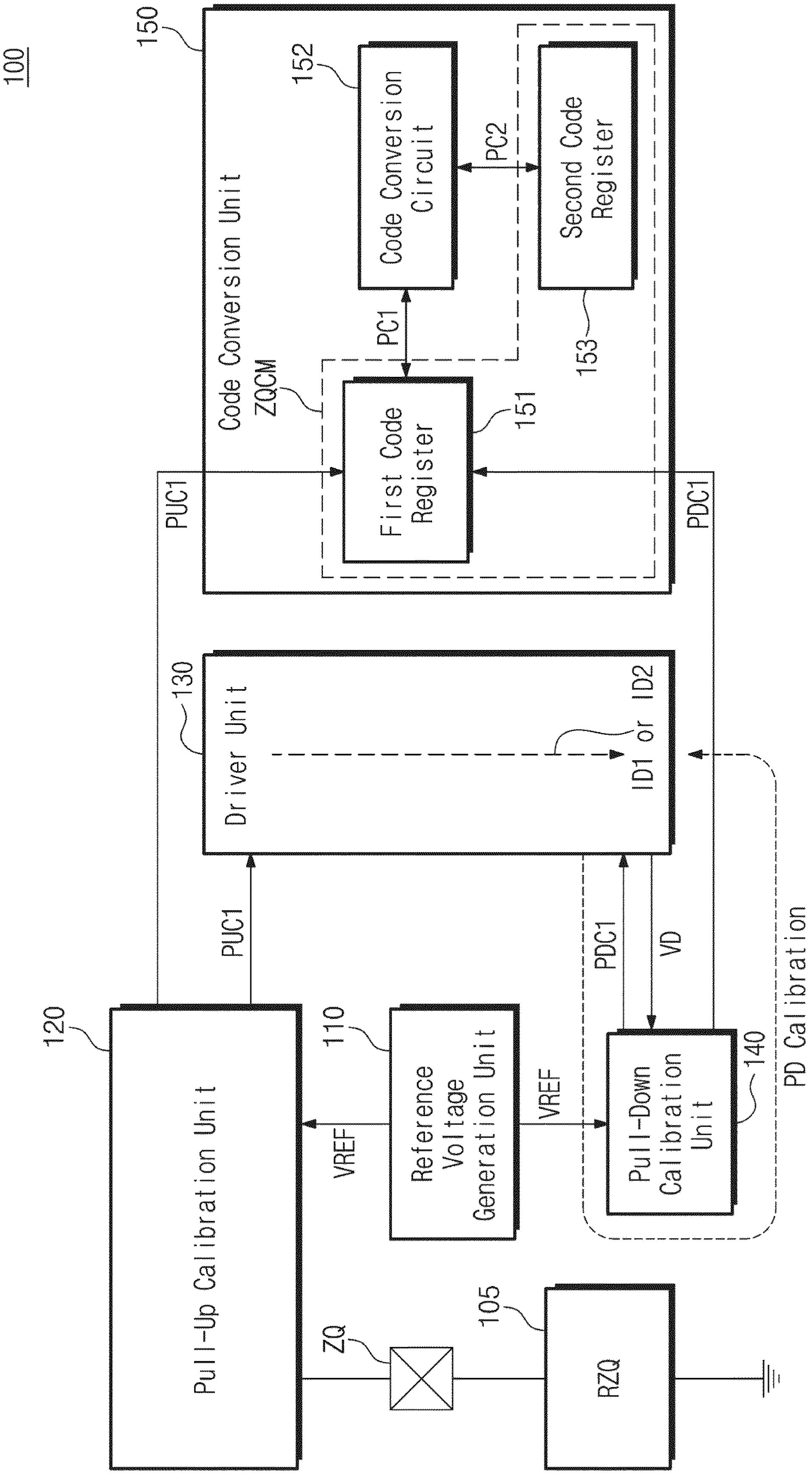
FIG. 2 is a block diagram illustrating a calibrator, according to some implementations of the present disclosure.

FIG. 2 is a block diagram illustrating a calibrator according to some implementations of the present disclosure. Referring to FIG. 2, the calibrator 100 may include a reference voltage generation unit 110, a pull-up calibration unit 120, a driver unit 130, a pull-down calibration unit 140, and a code conversion unit 150. The calibrator 100 may be connected to a ZQ pad ZQ and may provide impedance matching of a driver by performing pull-up calibration and pull-down calibration.

The reference voltage generation unit 110 (e.g., a circuit) may generate a reference voltage VREF. In some implementations, the reference voltage generation unit 110 may provide the reference voltage VREF to calibration units. For example, the reference voltage generation unit 110 may provide the reference voltage VREF to the pull-up calibration unit 120 and the pull-down calibration unit 140. In some implementations, the reference voltage VREF may be an arbitrary voltage between a power supply voltage VDD or VDDQ and a ground voltage VSS, VSSQ, or 0 V. For example, the magnitude of the reference voltage VREF may be VDDQ/2 or VDDQ/3. The following description will be given based on an example in which the calibrator 100 of FIG. 2 includes the reference voltage generation unit 110, but the present disclosure is not limited thereto. For example, it should be understood that the reference voltage generation unit 110 can be external to the calibrator 100, e.g., included in the memory system 1000 of FIG. 1 or included in the memory device 1200 of FIG. 1.

The pull-up calibration unit 120 (e.g., a circuit) may perform the pull-up calibration. The pull-up calibration may refer to an operation for providing impedance matching necessary for the operation of a pull-up driver PUD, e.g., a pull-up driver PUD as described with respect to FIG. 4. The pull-up calibration unit 120 may be connected to the ZQ pad ZQ, and a ZQ resistor (RZQ) 105 may be connected between the ZQ pad ZQ and a ground node. A resistance value of the ZQ resistor 105 may be determined based on the specification of the memory system 1000 of FIG. 1.

The pull-up calibration unit 120 may perform the pull-up calibration operation based on the voltage level of the ZQ pad ZQ (or an output voltage level VD of the driver unit 130) and the reference voltage VREF. In some implementations, the pull-up calibration unit 120 may provide the driver unit 130 or the code conversion unit 150 with a first pull-up code PUC1 generated through the calibration operation. The pull-up code may refer to a code which is provided to a pull-up calibration circuit (e.g., a pull-up calibration circuit 132 of FIG. 4) for impedance matching of a pull-up driver (e.g., the pull-up driver PUD of FIG. 4). In some implementations, the pull-up code may be a binary code. For example, the first pull-up code PUC1 may be a pull-up code corresponding to the case where the reference voltage VREF is a first voltage (e.g., VDDQ/2). Herein, the first voltage may be the voltage level of the ZQ pad ZQ or the output voltage level VD of the driver unit 130. A structure and an operation of the pull-up calibration unit 120 will be described in detail with reference to FIG. 3.

Like the driver of FIG. 1, the driver unit 130 (e.g., a circuit) may perform the interface operation in the memory system 1000. In some implementations, the driver unit 130 may include a pull-up driver and a pull-down driver. For example, the driver unit 130 may output a first logical value (e.g., logic "0") or a second logical value (e.g., logic "1"), based on pull-up driving or pull-down driving.

In some implementations, the driver unit 130 may receive a pull-up code or a pull-down code from the pull-up calibration unit 120 or the pull-down calibration unit 140. The driver unit 130 may provide the output voltage level VD of the output terminal to the pull-down calibration unit 140. In some implementations, the driver unit 130 may include a memory (e.g., a ZQ code-storing register or a ZQ code-storing volatile or non-volatile memory element) which manages pull-up codes or pull-down codes. In some implementations, the calibrator 100 may include a memory, which manages pull-up codes or pull-down codes, outside the driver unit 130. A structure of the driver unit 130 will be described in detail with reference to FIG. 4.

The pull-down calibration unit 140 (e.g., a circuit) may perform the pull-up calibration operation. The pull-down calibration may refer to an operation for providing impedance matching necessary for the operation of a pull-down driver PDD, e.g., the pull-down driver PDD of FIG. 4. In some implementations, the pull-down calibration unit 140 may be connected to the driver unit 130 and the reference voltage generation unit 110. The pull-down calibration unit 140 may receive the output voltage level VD of the driver unit 130 (e.g., a voltage level of the output terminal of the driver unit 130) and the reference voltage VREF and may generate a pull-down code based on the output voltage level VD and the level of the reference voltage VREF. The pull-down code may refer to a code which is provided to a pull-down calibration circuit (e.g., the pull-down calibration circuit 134 of FIG. 4) for impedance matching of a pull-down driver (e.g., the pull-down driver PDD of FIG. 4). In some implementations, the pull-down code may be a binary code.

The pull-down calibration unit 140 may perform the pull-down calibration operation by receiving the output voltage level VD from the driver unit 130 and providing a first pull-down code PDC1 to the driver unit 130. The pull-down calibration unit 140 may generate the first pull-down code PDC1 based on the pull-down calibration operation. In some implementations, the pull-down calibration unit 140 may provide the code conversion unit 150 with the first pull-down code PDC1 thus generated. For example, the first pull-down PDC1 may be a pull-up code corresponding to the case where the reference voltage VREF is the first voltage (VDDQ/2). Herein, like the pull-up calibration unit 120, the first voltage may be the voltage level of the ZQ pad ZQ or the output voltage level VD of the driver unit 130. A structure and an operation of the pull-down calibration unit 140 will be described in detail with reference to FIG. 5.

An example in which the driver unit 130 is included in the calibrator 100 is illustrated in FIG. 2, but the present disclosure is not limited thereto. Like the drivers illustrated and described with reference to FIG. 1, it should be understood that implementations in which the calibrator 100 does not include the driver unit 130 are within the scope of this disclosure.

A first ZQ code PC1 may correspond to the case where the reference voltage VREF is the first voltage and may indicate or include the first pull-up code PUC1 or the first pull-down code PDC1 corresponding to the first voltage. A second ZQ code PC2 may correspond to the case where the reference voltage VREF is a second voltage different from the first voltage and may indicate or include a first pull-up code or a second pull-down code corresponding to the second voltage. Likewise, an n-th ZQ code may correspond to the case where the reference voltage VREF is an n-th voltage and may indicate or include an n-th pull-up code or an n-th pull-down code corresponding to the n-th voltage (n being a natural number of 3 or more, which is equally applied to the following description). In some implementations, the first to n-th voltages may be different voltages. The voltage level of the reference voltage VREF may be equal to the voltage level of the ZQ pad ZQ or the voltage level of the output terminal of the driver unit 130 (e.g., the output voltage level VD of the driver unit 130). A first current level ID1 may be a level of a current flowing inside the driver unit 130 when the output voltage level VD is the first voltage (e.g., VDDQ/2), and a second current level ID2 may be a level of a current flowing inside the driver unit 130 when the output voltage level VD is the second voltage (e.g., VDDQ/3). Likewise, an n-th current level may be a level of a current flowing inside the driver unit 130 when the output voltage level VD is the n-th voltage. The magnitude of each of the first to n-th voltages may be an arbitrary voltage between the power supply voltage (e.g., VDDQ or VDD) and the ground voltage (e.g., VSSQ, VSS, or 0 V). The above magnitudes of the first and second voltages are provided as an example and should not be limited thereto.

The code conversion unit 150 (e.g., a circuit) may generate the second ZQ code PC2, based on the first ZQ code PC1. Referring to FIG. 2, the code conversion unit 150 may include a ZQ code management register ZQCM, and a code conversion circuit 152, and the ZQ code management register ZQCM may include a first code register 151 and a second code register 153. The code conversion unit 150 may receive the first pull-up code PUC1 or the first pull-down code PDC1 through the first code register 151. In some implementations, the code conversion unit 150 may convert the first ZQ code PC1 into the second ZQ code PC2 through the code conversion circuit 152 and may store the second ZQ code PC2 thus converted in the second code register 153.

An examples in which the code conversion unit 150 converts the first ZQ code PC1 into the second ZQ code PC2 is illustrated in FIG. 2, but the present disclosure is not limited thereto. For example, the code conversion unit 150 may convert additional ZQ codes depending on a configuration, a structure, an operation method, and an operation type of the memory system 1000 of FIG. 1. For example, the code conversion unit 150 may additionally generate third to n-th ZQ codes respectively corresponding to the third to n-th voltages by converting the first ZQ code PC1 for each case where the reference voltage VREF corresponds to each of the third to n-th voltages. The third to n-th ZQ codes may indicate or include the corresponding third to n-th pull-up codes or the corresponding third to n-th pull-down codes. The code conversion unit 150 may further include additional code registers, the number of which corresponds to the number of codes generated by the code conversion unit 150.

The first code register 151 may store the first ZQ code PC1. The first code register 151 may store the first pull-up code PUC1 or the first pull-down code PDC1. In some implementations, the first code register 151 may receive the first pull-up code PUC1 from the pull-up calibration unit 120 and may receive the first pull-down code PDC1 from the pull-down calibration unit 140. The first code register 151 may provide the code conversion circuit 152 with the first ZQ code PC1 including the first pull-up code PUC1 or the first pull-down code PDC1.

The code conversion circuit 152 may receive the first ZQ code PC1 and may generate the second ZQ code PC2 based on the first ZQ code PC1 thus received. In some implementations, the code conversion circuit 152 may convert the first ZQ code PC1 to generate the second ZQ code PC2. The code conversion circuit 152 may provide the second code register 153 with the second ZQ code PC2 thus generated.

In some implementations, the code conversion circuit 152 may perform the conversion between the first ZQ code PC1 and the second ZQ code PC2 based on a ratio of the first current level ID1 and the second current level ID2. For example, referring to FIG. 4 to be discussed later, the code conversion circuit 152 may perform the conversion between the first ZQ code PC1 and the second ZQ code PC2 based on a ratio of currents flowing to a sixth node N6 and a second node N2 of FIG. 4 when the reference voltage VREF is the first voltage and a current flowing to the sixth node N6 and the second node N2 when the reference voltage VREF is the second voltage.

Figure 4:
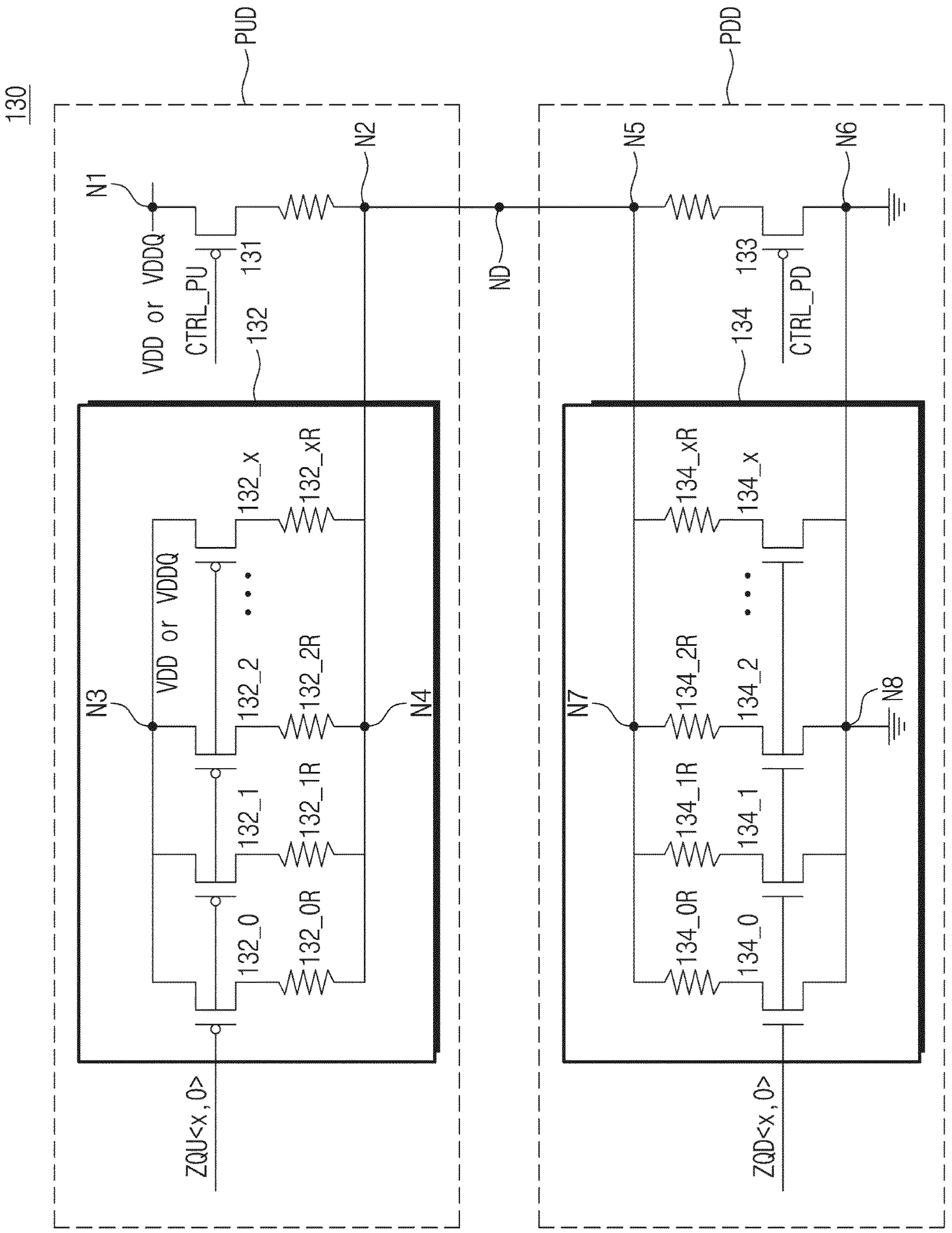
FIG. 4 is a block diagram illustrating a driver unit, according to some implementations of the present disclosure.

In some implementations, the code conversion circuit 152 may perform the conversion between the first ZQ code PC1 and the second ZQ code PC2 based on a ratio of output impedance values of the pull-up calibration circuit 132 of FIG. 4, which can be determined based on voltage levels of the reference voltage VREF. For example, the code conversion circuit 152 may perform the conversion between the first ZQ code PC1 and the second ZQ code PC2 based on a ratio of a first output impedance of a pull-up calibration circuit when the reference voltage VREF is the first voltage and a second output impedance of the pull-up calibration circuit when the reference voltage VREF is the second voltage. In some implementations, the code conversion circuit 152 may perform the conversion between the first ZQ code PC1 and the second ZQ code PC2 based on a ratio of output impedance values of a pull-down calibration circuit 134 of FIG. 4, which can be determined based on voltage levels of the reference voltage VREF.

In some implementations, the conversion of the first ZQ code PC1 and the second ZQ code PC2 may be performed based on a ratio of the first current level ID1 and the second current level ID2 measured from an arbitrary die which the memory system 1000 of FIG. 1 includes. For example, the conversion of the first ZQ code PC1 and the second ZQ code PC2 may be performed based on a ratio of the first current level ID1 and the second current level ID2 measured from one die which is able to include a plurality of memory cells of the memory device 1200. As another example, the conversion of the first ZQ code PC1 and the second ZQ code PC2 may be performed based on a ratio of the first current level ID1 and the second current level ID2 of one die arbitrarily selected from a plurality of dies included in a board including the memory system 1000 of FIG. 1. A structure and an operation of the code conversion circuit 152 will be described in detail with reference to FIGS. 6 to 9.

The second code register 153 may store a pull-up code PUC2 or a pull-down code PDC2 corresponding to the second voltage. In some implementations, the second code register 153 may receive the second ZQ code PC2 from the code conversion circuit 152. For example, the second code register 153 may receive and store the second ZQ code PC2 including the second pull-up code PUC2 or the second pull-down code PDC2 from the code conversion circuit 152.

The first code register 151 and the second code register 153 may provide ZQ codes stored therein to a ZQ code management memory included in the memory system 1000 of FIG. 1. For example, the ZQ code management memory may be included in the memory system 1000 of FIG. 1 and may include the ZQ code registers or the volatile or non-volatile memory elements storing the first to n-th ZQ codes, which are described above. In some implementations, the first code register 151 and the second code register 153 may provide the first ZQ code PC1 or the second ZQ code PC2 to the driver unit 130.

As described above, the calibrator 100 of FIG. 2 may generate a ZQ code of a single voltage level based on the calibration operation at the ZQ pad ZQ and may generate ZQ codes of a plurality of voltage levels based on the generated ZQ code. The calibrator 100 may also generate ZQ codes of an arbitrary voltage level different from the first voltage level and the second voltage level described above, based on the operation of the code conversion circuit 152. Compared to the case of converting the reference voltage VREF from a first reference voltage to a second reference voltage and obtaining ZQ codes associated with two reference voltages, the calibrator 100 of FIG. 2 may obtain ZQ codes associated with two voltages within a shorter calibration time. The calibrator 100 of FIG. 2 may allow the memory device 1200 or the memory system 1000 to perform the interface operation more stably, and thus, loss of data may be reduced or prevented.

Figure 3:
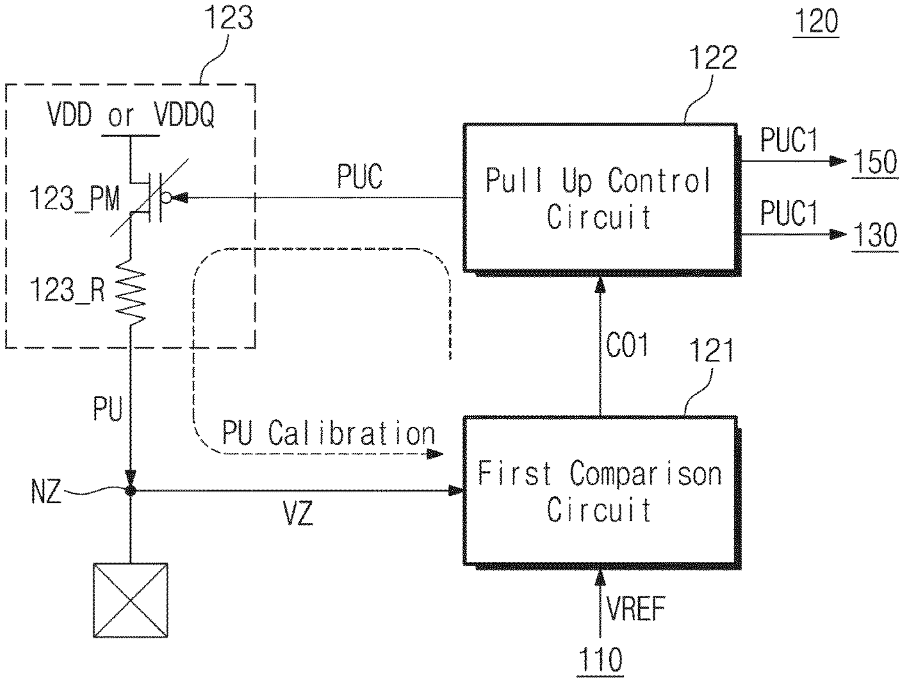
FIG. 3 is a block diagram illustrating a pull-up calibration unit, according to some implementations of the present disclosure.

FIG. 3 is a block diagram illustrating a pull-up calibration unit, e.g., the pull-up calibration unit 120 of FIG. 2, according to some implementations of the present disclosure. Referring to FIG. 3, the pull-up calibration unit 120 may include a first comparison circuit 121, a pull-up control circuit 122, and a pull-up calibration circuit 123.

The first comparison circuit 121 may compare the reference voltage VREF and a ZQ voltage VZ of a ZQ node NZ. In some implementations, the first comparison circuit 121 may compare the ZQ voltage VZ and the reference voltage VREF and may generate a first comparison signal CO1 based on a difference therebetween. For example, the first comparison circuit 121 may include an operational amplifier (OP AMP) which receives the ZQ voltage VZ or the reference voltage VREF as an inverting input or a non-inverting input and outputs the first comparison signal CO1 as an output signal.

The pull-up control circuit 122 may control the operation of the pull-up calibration circuit 123. In some implementations, the pull-up control circuit 122 may generate a pull-up control signal PUC based on the first comparison signal CO1. For example, the pull-up control circuit 122 may generate the pull-up control signal PUC in the form of a binary code. The pull-up control signal PUC will be described in detail together with the pull-up calibration circuit 123. The pull-up control circuit 122 may provide the code conversion unit 150 or the driver unit 130 of FIG. 2 with a pull-up code generated as a result of the pull-up calibration operation. For example, when the reference voltage VREF is the first voltage, the pull-up control circuit 122 may provide the first pull-up code PUC1 generated by the pull-up calibration to each of the driver unit 130 and the code conversion unit 150.

The pull-up calibration circuit 123 may receive the pull-up control signal PUC from the pull-up control circuit 122 and may generate a pull-up calibration signal PU in response to the pull-up control signal PUC thus received. In some implementations, the pull-up calibration circuit 123 may include a plurality of p-type metal-oxide-semiconductor field-effect transistors (MOSFET) (hereinafter referred to as "PMOS transistors"). For example, the pull-up calibration circuit 123 may include a plurality of PMOS transistors 123_PM, which operate in response to the pull-up control signal PUC and include first ends connected to a power node and second ends respectively connected to pull-up resistors 123_R. First ends of the pull-up resistors 123_R may be connected to the ZQ node NZ, and second ends thereof may be connected to the plurality of PMOS transistors 123_PM.

In some implementations, the plurality of PMOS transistors 123_PM may include individual PMOS transistors corresponding to a binary code, and the individual PMOS transistors may have different sizes (e.g., W/L). Examples of the plurality of PMOS transistors 123_PM and the pull-up resistors 123_R will be described in detail with reference to the pull-up calibration circuit 132 or the pull-down calibration circuit 134 of FIG. 4. For example, in some implementations, the pull-up calibration circuit 123 can have the structure described with respect to the pull-up calibration circuit 132. In some implementations, the pull-up calibration circuit 123 may provide the pull-up calibration signal PU to the ZQ node NZ in response to the pull-up control signal PUC. The voltage level of the ZQ node NZ and a magnitude of the impedance of the ZQ node NZ may change depending on the pull-up calibration signal PU. In some implementations, the pull-up calibration signal PU may include a voltage signal or a current signal.

The pull-up calibration unit 120 may perform the pull-up (PU) calibration operation through the first comparison circuit 121, the pull-up control circuit 122, and the pull-up calibration circuit 123. For example, depending on the operation of the pull-up calibration circuit 123, the ZQ voltage VZ may change due to the pull-up calibration signal PU, and the first comparison circuit 121 may generate a new first comparison signal CO1 based on a new ZQ voltage VZ.

As in the above method, the pull-up control circuit 122 may generate a new pull-up control signal PUC based on the new first comparison signal CO1. The pull-up calibration circuit 123 may generate a new pull-up calibration signal PU in response to the new pull-up control signal PUC thus generated such that the voltage level of the ZQ node NZ again changes. The above process may be performed until the voltage level of the ZQ voltage VZ of the ZQ node NZ converges to (e.g., is equal to) the reference voltage VREF. When the ZQ voltage VZ is equal to the reference voltage VREF, the pull-up control circuit 122 may provide a pull-up code (e.g., the first pull-up code PUC1) corresponding to the reference voltage VREF to the driver unit 130 or the code conversion unit 150.

FIG. 4 is a block diagram illustrating a driver unit, e.g., the driver unit 130 of FIG. 2, in detail, according to some implementations of the present disclosure. Referring to FIG. 4, the driver unit 130 may include the pull-up driver PUD performing a pull-up operation and the pull-down driver PDD performing a pull-down operation, the pull-up driver PUD may include a pull-up driving circuit 131 and the pull-up calibration circuit 132, and the pull-down driver PDD may include a pull-down driving circuit 133 and the pull-down calibration circuit 134.

The pull-up driving circuit 131 may perform the pull-up operation. In some implementations, the pull-up driving circuit 131 may include a PMOS transistor. For example, the pull-up driving circuit 131 may include a PMOS transistor which operates in response to a pull-up driving control signal CTRL_PU and includes a first end connected to a first node N1 and a second end connected to the second node N2 through a resistive element. A voltage level of the first node N1 may be the power supply voltage VDD or VDDQ. The pull-up driving circuit 131 is described as including a resistive element, but the present disclosure is not limited thereto. For example, it should be understood that a pull-up driving circuit not including a resistive element is also within the scope of this disclosure.

In some implementations, the second node N2 may be connected to a driving node ND that is the output terminal of the driver unit 130. For example, the pull-up driving circuit 131 may output a pull-up signal generated in response to the pull-up driving control signal CTRL_PU, through the second node N2 and the driving node ND. Depending on the operation type of the memory system 1000 of FIG. 1, when the pull-up driving circuit 131 is turned on in response to the pull-up driving control signal CTRL_PU, the pull-up driving circuit 131 may output a first logical value (e.g., logic "1") through the driving node ND.

The pull-up calibration circuit 132 may set an operation voltage level or an operation current level of the pull-up driver PUD such that impedance matching between the pull-up driver PUD and the interface channel is performed. In some implementations, the pull-up calibration circuit 132 may operate in response to a pull-up ZQ code ZQU<x,0>. The pull-up ZQ code ZQU<x,0> may include pull-up codes among ZQ codes provided from the pull-up calibration unit 120 of FIG. 2 or the ZQ code management memory and may be provided in the form of a binary code. For example, the pull-up calibration circuit 132 may set the operation voltage level or the operation current level of the pull-up driver PUD in response to the pull-up ZQ code ZQU<x,0> or may provide the impedance matching with the interface channel to the pull-up driver PUD.

The pull-up calibration circuit 132 may include a plurality of PMOS transistors 132_0 to 132_*x*. For example, the pull-up calibration circuit 132 may include the plurality of PMOS transistors 132_0 to 132_*x*, the number of which is equal to the number of binary digits of the pull-up ZQ code ZQU<x,0>. In some implementations, each of the plurality of PMOS transistors 132_0 to 132_*x* may operate in response to a signal of a corresponding bit position of the pull-up ZQ code ZQU<x,0>. For example, the 0-th PMOS transistor 132_0 may operate in response to a signal of the 0-th bit position of the pull-up ZQ code ZQU<x,0>, the first PMOS transistor 132_1 may operate in response to a signal of the first bit position of the pull-up ZQ code ZQU<x,0>, and the x-th PMOS transistor 132_*x* may operate in response to a signal of the x-th bit position of the pull-up ZQ code ZQU<x,0>.

The plurality of PMOS transistors 132_0 to 132_*x* may be connected in parallel. For example, first ends of the plurality of PMOS transistors 132_0 to 132_*x* may be connected to a third node N3. A second end of each of the plurality of PMOS transistors 132_0 to 132_*x* may be connected to a corresponding resistive element among resistive elements 132_OR to 132_xR. For example, the 0-th PMOS transistor 132_0 may be connected to the third node N3 and the 0-th resistive element 132_OR. The resistive elements 132_OR to 132_xR may be connected to each other through a fourth node N4. In some implementations, the resistive elements 132_OR to 132_xR may have the same resistance value.

FIG. 4 shows an example in which the pull-up calibration circuit 132 includes the resistive elements 132_OR to 132_xR, but the present disclosure is not limited thereto. It should be understood that implementations in which various of the resistive elements 132_OR to 132_xR are included or are not included are within the scope of this disclosure. A voltage level of the third node N3 may be the power supply voltage VDD or VDDQ.

In some implementations, the plurality of PMOS transistors 132_0 to 132_*x* may have different sizes (e.g., W/L). For example, a ratio of the sizes of the plurality of PMOS transistors 132_0 to 132_*x* may be a magnitude corresponding to the number of binary digits of the pull-up ZQ code ZQU<x,0> (e.g., may be a ratio of powers of 2). For example, when the size of the 0-th PMOS transistor 132_0 is (W/L), the size of the first PMOS transistor 132_1 may be 2 (W/L), the size of the second PMOS transistor 132_2 may be 4 (W/L), and the size of the x-th PMOS transistor 132_*x* may be $2^x$(W/L). Based on the above structure, the plurality of PMOS transistors 132_0 to 132_*x* may generate a current whose magnitude (or level) corresponds to the pull-up ZQ code ZQU<x,0>. Through the above operations, the pull-up calibration circuit 132 may set the operation voltage level or the operation current level of the pull-up driver PUD and may provide impedance matching of the output terminal of the pull-up driving circuit 131.

In some implementations, the pull-up driving circuit 131 and the pull-up calibration circuit 132 may be connected in parallel. For example, as illustrated in FIG. 4, the second node N2 of the pull-up driving circuit 131 and the fourth node N4 of the pull-up calibration circuit 132 may be connected to each other. However, the present disclosure is not limited thereto. For example, it should be understood that implementations in which the pull-up driving circuit 131 and the pull-up calibration circuit 132 are connected in series are also within the scope of this disclosure. For example, the second node N2 of the pull-up driving circuit 131 and the third node N3 of the pull-up calibration circuit 132 may be connected, and the fourth node N4 of the pull-up calibration circuit 132 may be connected to the driving node ND.

The pull-down driving circuit 133 may perform the pull-down operation. In some implementations, the pull-down driving circuit 133 may include an n-type metal-oxide-semiconductor field-effect-transistor (MOSFET) (hereinafter referred to as an "NMOS transistor"). For example, the pull-down driving circuit 133 may include an NMOS transistor which operates in response to a pull-down driving control signal CTRL_PD and includes a first end connected to the sixth node N6 and a second end connected to a fifth node N5 through a resistive element. A voltage level of the sixth node N6 may be the ground voltage VSS, VSSQ or 0 V. The pull-down driving circuit 133 is described as including a resistive element, but the present disclosure is not limited thereto. For example, it should be understood that a pull-down driving circuit not including a resistive element is also within the scope of this disclosure.

In some implementations, the fifth node N5 may be connected to the driving node ND that is the output terminal of the driver unit 130. For example, the pull-down driving circuit 133 may output a pull-down signal generated in response to the pull-down driving control signal CTRL_PD, through the fifth node N5 and the driving node ND. Depending on the operation type of the memory system 1000 of FIG. 1, when the pull-down driving circuit 133 is turned on in response to the pull-down driving control signal CTRL_PD, the pull-down driving circuit 133 may output a second logical value (e.g., logic "0") through the driving node ND.

The pull-down calibration circuit 134 may set an operation voltage level or an operation current level of the pull-down driver PDD such that the impedance matching between the pull-down driver PDD and the interface channel is made. In some implementations, the pull-down calibration circuit 134 may operate in response to a pull-down ZQ code ZQD<x,0>. The pull-down ZQ code ZQD<x,0> may include pull-down codes among ZQ codes provided from the pull-down calibration unit 140 of FIG. 2 or the ZQ code management memory and may be provided in the form of a binary code. For example, the pull-down calibration circuit 134 may set the operation voltage level or the operation current level of the pull-down driver PDD in response to the pull-down ZQ code ZQD<x,0> or may provide the impedance matching with the interface channel to the pull-down driver PDD.

The pull-down calibration circuit 134 may include a plurality of NMOS transistors 134_0 to 134_*x*. For example, the pull-down calibration circuit 134 may include the plurality of NMOS transistors 134_0 to 134_*x*, the number of which is equal to the number of binary digits of the pull-down ZQ code ZQD<x,0>. In some implementations, each of the plurality of NMOS transistors 134_0 to 134_*x* may operate in response to a signal of a corresponding bit position of the pull-down ZQ code ZQD<x,0>. For example, the 0-th NMOS transistor 134_0 may operate in response to a signal of the 0-th bit position of the pull-down ZQ code ZQD<x,0>, the first NMOS transistor 134_1 may operate in response to a signal of the first bit position of the pull-down ZQ code ZQD<x,0>, and the x-th NMOS transistor 134_*x* may operate in response to a signal of the x-th bit position of the pull-down ZQ code ZQD<x,0>.

The plurality of NMOS transistors 134_0 to 134_*x* may be connected in parallel. For example, first ends of the plurality of NMOS transistors 134_0 to 134_*x* may be connected to an eighth node N8. A second end of each of the plurality of NMOS transistors 134_0 to 134_*x* may be connected to a corresponding resistive element among resistive elements 134_OR to 134_xR. For example, the 0-th NMOS transistor 134_0 may be connected to the eighth node N8 and the 0-th resistive element 134_OR. The resistive elements 134_OR to 134_xR may be connected to each other through a seventh node N7. In some implementations, the resistive elements 134_OR to 134_xR may have the same resistance value.

FIG. 4 shows an examples in which the pull-down calibration circuit 134 includes the resistive elements 134_OR to 134_xR, but the present disclosure is not limited thereto. It should be understood that implementations in which various of the resistive elements 134_OR to 134_xR are included or not included are also within the scope of this disclosure. A voltage level of the eighth node N8 may be the ground voltage VSS, VSSQ or 0 V.

In some implementations, the plurality of NMOS transistors 134_0 to 134_*x* may have different sizes (e.g., W/L). For example, a ratio of the sizes of the plurality of NMOS transistors 134_0 to 134_*x* may be a magnitude corresponding to the number of binary digits of the pull-down ZQ code ZQD<x,0> (e.g., may be a ratio of powers of 2). For example, when the size of the 0-th NMOS transistor 134_0 is (W/L), the size of the first NMOS transistor 134_1 may be 2 (W/L), the size of the second NMOS transistor 134_2 may be 4 (W/L), and the size of the x-th NMOS transistor 134_*x* may be 2x (W/L). Based on the above structure, the plurality of NMOS transistors 134_0 to 134_*x* may generate a current whose magnitude (or level) corresponds to the pull-down ZQ code ZQD<x,0>. Through the above operations, the pull-down calibration circuit 134 may set the operation voltage level or the operation current level of the pull-down driver PDD and may provide impedance matching of the output terminal of the pull-down driving circuit 133.

In some implementations, the pull-down driving circuit 133 and the pull-down calibration circuit 134 may be connected in parallel. For example, as illustrated in FIG. 4, the fifth node N5 of the pull-down driving circuit 133 and the seventh node N7 of the pull-down calibration circuit 134 may be connected to each other. However, the present disclosure is not limited thereto. For example, it should be understood that implementations in which the pull-down driving circuit 133 and the pull-down calibration circuit 134 are connected in series are also within the scope of this disclosure. For example, the fifth node N5 of the pull-down driving circuit 133 and the eighth node N8 of the pull-down calibration circuit 134 may be connected, and the seventh node N7 of the pull-down calibration circuit 134 may be connected to the driving node ND.

The above description of the driver unit 130 is provided as an example, and the present disclosure is not limited thereto. It should be understood that implementations in which the pull-up calibration circuit 132 includes NMOS transistors or implementations in which the pull-down calibration circuit 134 includes PMOS transistors are also within the scope of this disclosure. Moreover, the logical values which the driver unit 130 outputs are provided as an example, and the present disclosure is not limited thereto. In some implementations, the driver unit 130 may output "n" logical values depending on a structure, an operation method, and an operation type of the memory system 1000 of FIG. 1. For example, the pull-up driving circuit 131 or the pull-down driving circuit 133 may output first to fourth logical values (e.g., 00, 01, 10, and 11) in response to the pull-up driving control signal CTRL_PU or the pull-down driving control signal CTRL_PD.

Figure 5:
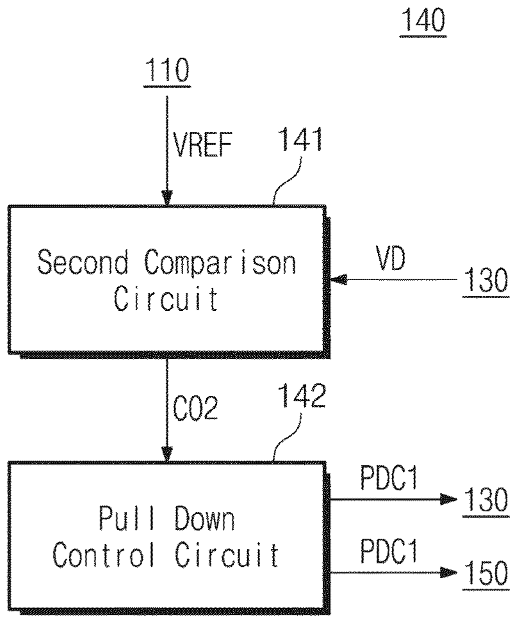
FIG. 5 is a block diagram illustrating a pull-down calibration unit, according to some implementations of the present disclosure.

FIG. 5 is a block diagram illustrating a pull-down calibration unit, e.g., the pull-down calibration unit 140 of FIG. 2, in detail, according to some implementations of the present disclosure. Referring to FIG. 5, the pull-down calibration unit 140 may include a second comparison circuit 141 and a pull-down control circuit 142.

The second comparison circuit 141 may compare the reference voltage VREF and the output voltage level VD of the driving node ND. In some implementations, the second comparison circuit 141 may compare the output voltage level VD and the reference voltage VREF and may generate a second comparison signal CO2 based on a difference therebetween. For example, the second comparison circuit 141 may include an operational amplifier which receives the output voltage level VD or the reference voltage VREF as a non-inverting input or an inverting input and outputs the second comparison signal CO2 as an output signal.

The pull-down control circuit 142 may control the operation of the pull-down calibration circuit 134 of FIG. 4. In some implementations, the pull-down control circuit 142 may generate a pull-down control signal PDC based on the second comparison signal CO2. For example, the pull-down control circuit 142 may generate the pull-down control signal PDC in the form of a binary code. The pull-down control signal PDC may correspond to the pull-down ZQ code ZQD<x,0> of FIG. 4. In some implementations, the pull-down control circuit 142 may provide the code conversion unit 150 and the driver unit 130 of FIG. 2 with a pull-down code generated after the pull-down calibration operation. For example, the pull-down control circuit 142 may provide the first pull-down code PDC1, which corresponds to the case where the reference voltage VREF is the first voltage, to each of the driver unit 130 and the code conversion unit 150.

Referring to FIGS. 2, 4, and 5 together, the pull-down calibration unit 140 may perform the pull-down (PD) calibration operation together with the driver unit 130. For example, the output voltage level VD of the driving node ND may vary depending on the operation of the pull-down calibration circuit 134 of FIG. 3, and the second comparison circuit 141 may generate a new second comparison signal CO2 based on a new output voltage level VD and the reference voltage VREF. The pull-down control circuit 142 may generate a new pull-down control signal PDC based on the new second comparison signal CO2. The pull-down calibration circuit 134 of FIG. 4 may again change the output voltage level VD of the driving node ND in response to the new pull-down control signal PDC (i.e., the pull-down ZQ code ZQD<x,0>) thus generated.

The above process may be performed until the output voltage level VD of the driving node ND converges to (e.g., is equal to) the reference voltage VREF. When the output voltage level VD of the driving node ND is equal to the reference voltage VREF, the pull-down control circuit 142 may provide a pull-down code (e.g., the first pull-down code PDC1) corresponding to the reference voltage VREF to the driver unit 130 or the code conversion unit 150.

Figure 6:
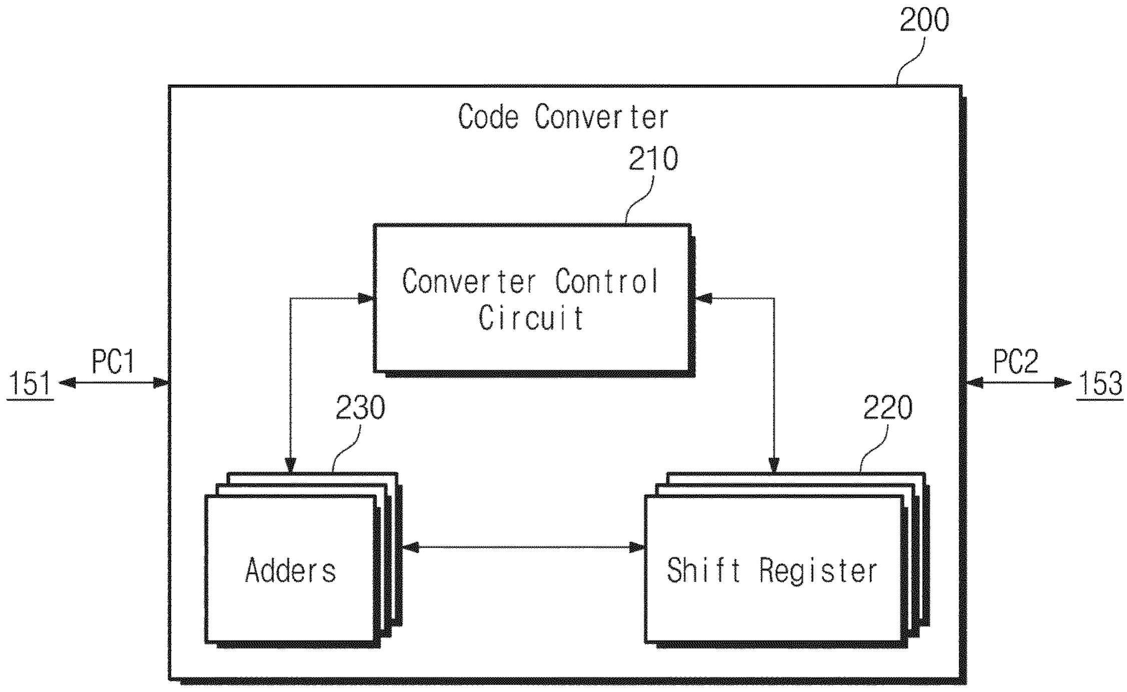
FIG. 6 is a block diagram illustrating a code converter, according to some implementations of the present disclosure.

FIG. 6 is a block diagram illustrating a code converter 200 (e.g., a circuit) according to some implementations of the present disclosure in detail. The code converter 200 may correspond to the code conversion circuit 152 of FIG. 2. Referring to FIG. 6, the code converter 200 may include a converter control circuit 210, shift registers 220, and adders 230.

The converter control circuit 210 may control the conversion between ZQ codes. In some implementations, the converter control circuit 210 may store information about a relationship between the first ZQ code PC1 and ZQ codes corresponding to various reference voltages VREF (or the output voltage level VD of the driving node ND or the voltage of the ZQ pad ZQ). For example, the converter control circuit 210 may include a look-up table which includes a relation equation for the conversion between ZQ codes. The look-up table may include a relation equation between the first ZQ code PC1 targeted for the conversion and the second to n-th ZQ codes capable of being generated based on the conversion.

In some implementations, the relation equation may be generated based on a ratio of the first current level ID1 of the driver unit 130 at the first voltage corresponding to the first ZQ code PC1 and one of current levels of the driver unit 130 at voltages corresponding to the second ZQ code PC2 to the n-th ZQ code. In some implementations, the relation equation may be generated based on a ratio of output impedances of the pull-up calibration circuit 132 or the pull-down calibration circuit 134 of FIG. 4, which are determined depending on voltage levels of the reference voltage VREF.

In some implementations, the converter control circuit 210 may control the shift registers 220 and the adders 230 for the purpose of the conversion of ZQ codes. For example, the converter control circuit 210 may control the shift registers 220 and the adders 230 for the purpose of converting the first ZQ code PC1 into the second ZQ code PC2. In some implementations, the converter control circuit 210 may control the shift registers 220 or the adders 230 such that the relation equation included in the look-up table is implemented. An operation in which the converter control circuit 210 controls the shift registers 220 and the adders 230 to convert ZQ codes will be described in detail with reference to FIGS. 8 and 9.

In some implementations, the converter control circuit 210 may add padding bits to bit positions below the least significant bit (LSB) of a ZQ code as much as the given number of bits or may add padding bits to bit positions above the most significant bit (MSB) of a ZQ code as much as the given number of bits. For example, the converter control circuit 210 may pad 5 zero bits to bit positions below the least significant bit of a ZQ code (e.g., may perform zero padding). Based on the addition of digits, the converter control circuit 210 may express decimal places of each ZQ code or may allow ZQ codes with a larger number of digits to be generated based on calculation. The MSB may indicate a bit of the highest bit position of a ZQ code, and the LSB may indicate a bit of the lowest bit position of a ZQ code. The above operation of the converter control circuit 210 will be described in detail with reference to FIGS. 8 and 9.

The above description of the converter control circuit 210 is provided as an example, and the present disclosure is not limited thereto. It should be understood that implementations in which information about the relationship (e.g., a relation equation) between first ZQ code PC1 and the second to n-th ZQ codes PC2 to PCn is included in a form different from a look-up table form are also within the scope of this disclosure. Also, implementations in which the converter control circuit 210 controls the conversion between ZQ codes is provided as an example, and the present disclosure is not limited thereto. It should be understood that implementations in which any other device, unit, or circuit in the memory system 1000 of FIG. 1 controls the shift registers 220 or the adders 230 is within the scope of this disclosure.

The shift registers 220 may shift and store the bits of the first ZQ code PC1 thus received. In some implementations, the first ZQ code PC1 which the shift registers 220 receives may include padding bits added to the bit positions below the LSB or may include padding bits added to the bit positions above the MSB. For example, the first ZQ code PC1 thus received may include 5 zero bits padded to five bit positions below the LSB, and thus, values below the decimal point may be expressed.

In some implementations, the shift registers 220 may store a result of shifting the bits of the first ZQ code PC1 to multiple bit positions. For example, the shift registers 220 may store a first conversion code obtained by right shifting one bit of the first ZQ code PC1, a second conversion code obtained by right shifting three bits of the first ZQ code PC1, or a third conversion code obtained by left shifting the first ZQ code PC1. The shift registers 220 may provide the adders 230 with a plurality of conversion codes generated by shifting the first ZQ code PC1. The operation of the shift registers 220 will be described in detail with reference to FIGS. 8 and 9.

The adders 230 may add the first ZQ code PC1 and conversion codes received from the shift registers 220. For example, the adders 230 may perform addition between the first ZQ code PC1 and conversion codes or between the conversion codes, and may generate the second ZQ code PC2 to the n-th ZQ code. The adders 230 may provide each of the second to n-th ZQ codes thus generated to the corresponding second code register 153 of FIG. 2 or may provide the second to n-th ZQ codes to code registers capable of storing any other ZQ codes. The adders 230 will be described in detail with reference to FIGS. 8 and 9.

The structure of the code converter 200 described above is provided as an example, and the present disclosure is not limited thereto. For example, in some implementations, the code converter 200 may perform a subtraction operation. It should be understood that implementations in which the code converter 200 further includes a complement generation circuit (e.g., a 2's complement generation circuit) and implementations in which a sign bit is added to ZQ codes are also within the scope of this disclosure.

Figure 7A:
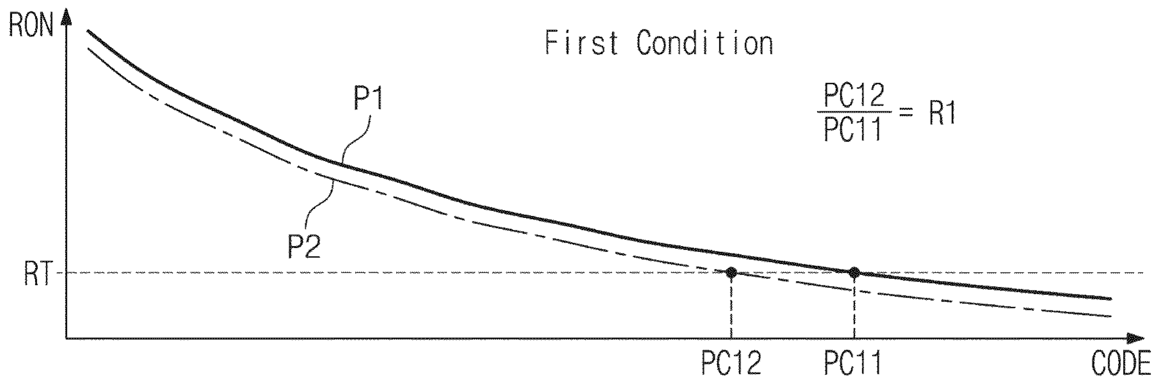
FIGS. 7A-7B are graphs illustrating changes in ZQ codes, according to some implementations of the present disclosure.
Figure 7B:
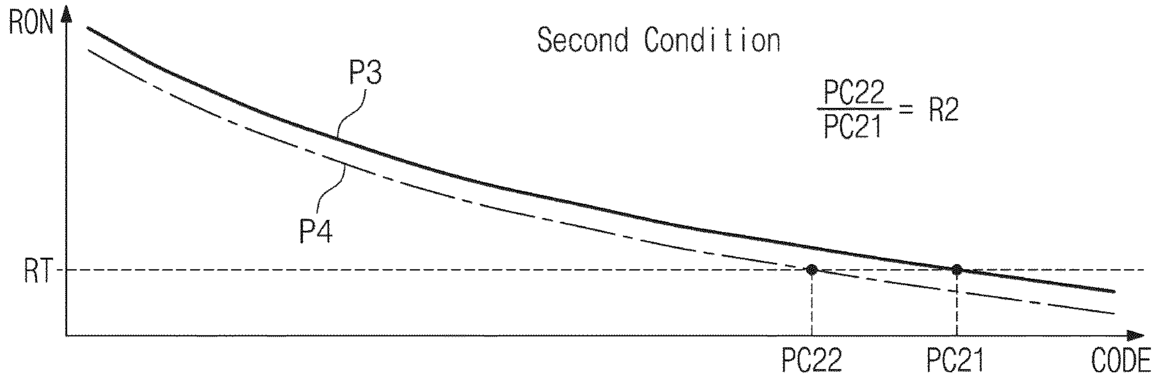

FIGS. 7A and 7B are graphs illustrating how a first ZQ code and a second ZQ code change relative to an impedance value of the ZQ pad ZQ of FIG. 1 when an operating environment of the memory system 1000 of FIG. 1 changes, according to some implementations of the present disclosure. FIG. 7A shows a change in the first ZQ code and the second ZQ code relative to the impedance value of the ZQ pad ZQ of FIG. 2 under a first condition, and FIG. 7B shows a change in the first ZQ code and the second ZQ code relative to the impedance value of the ZQ pad ZQ of FIG. 2 under a second condition.

In FIGS. 7A and 7B, the vertical axis represents an output resistance value RON of the ZQ pad ZQ of FIG. 2, and the horizontal axis represents a magnitude of a value of a ZQ code. A target resistance value RT may be the output resistance value RON for impedance matching through the ZQ calibration described with reference to FIGS. 2 to 6. In some implementations, the target resistance value RT may be the same as the resistance value of the ZQ resistor 105 of FIG. 2. A first state and a second state may include PVT conditions. For example, the first state may indicate a state of fast processing, high voltage, and high temperature, and the second state may indicate a state of slow processing, low voltage, and low temperature.

Referring to FIG. 7A, a first graph P1 showing the relationship between the output resistance value RON and the first ZQ code PC1 of FIG. 2 in the first state and a second graph P2 showing the relationship between the output resistance value RON and the second ZQ code PC2 of FIG. 2 in the second state are illustrated. Referring to the first graph P1 and the second graph P2, as a code value increases, the magnitude of the output resistance value RON may decrease.

When the output resistance value RON corresponds to the target resistance value RT, a value of the horizontal axis of the first graph P1 may indicate a first ZQ code PC11 of the first state, and a value of the horizontal axis of the second graph P2 may indicate a second ZQ code PC12 of the first state. A ratio of the second ZQ code P12 to the first ZQ code P11 may be a first ratio R1. In some implementations, as described with reference to FIGS. 2 to 6, the first ratio R1 may correspond to a conversion ratio which is generated based on a current value of the driver unit 130, an output impedance of a calibration circuit, or a current or output impedance value of the driver unit 130 measured from an arbitrary die included in the memory system 1000 of FIG. 1, depending on the magnitude of the reference voltage VREF.

Referring to FIG. 7B, a third graph P3 showing the relationship between the output resistance value RON and the first ZQ code PC1 of FIG. 2 in the second state and a fourth graph P4 showing the relationship between the output resistance value RON and the second ZQ code PC2 of FIG. 2 in the second state are illustrated. Referring to the third graph P3 and the fourth graph P4, as a code value increases, the magnitude of the output resistance value RON may decrease.

When the output resistance value RON corresponds to the target resistance value RT, a value of the horizontal axis of the third graph P3 may indicate a first ZQ code PC21 of the second state, and a value of the horizontal axis of the fourth graph P4 may indicate a second ZQ code PC22 of the second state. A ratio of the second ZQ code P22 to the first ZQ code P21 may be a second ratio R2. In some implementations, as described with reference to FIGS. 2 to 6, the second ratio R2 may correspond to a conversion ratio which is generated based on a current value of the driver unit 130, an output impedance of a calibration circuit, or a current or output impedance value of the driver unit 130 measured from an arbitrary die included in the memory system 1000 of FIG. 2, depending on the magnitude of the reference voltage VREF.

Figure 8:
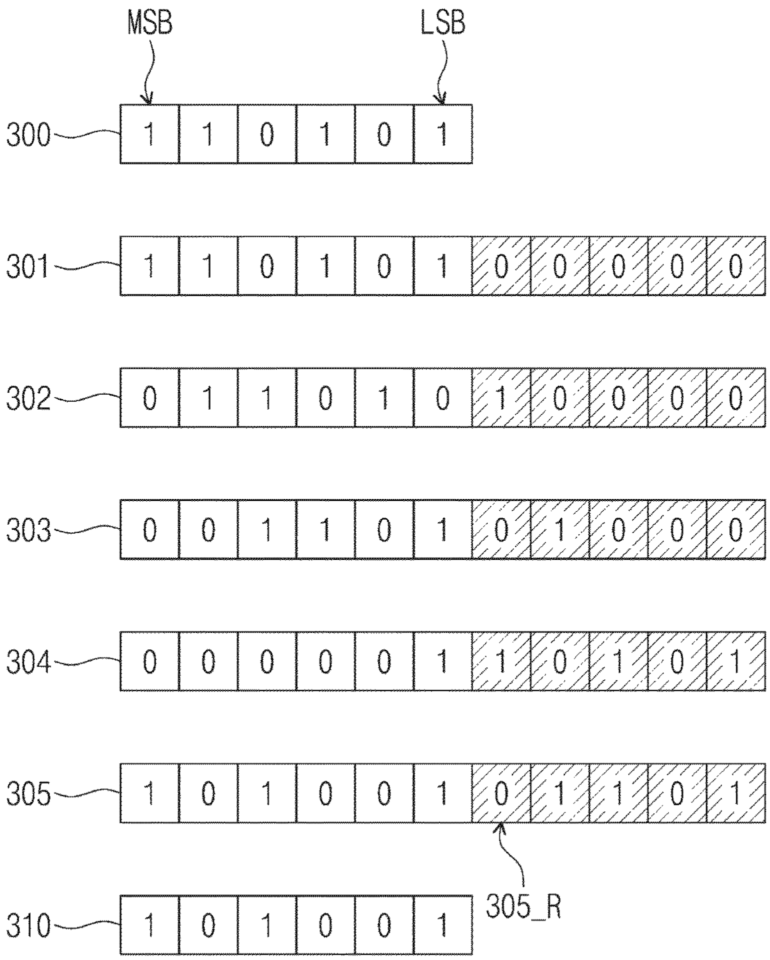
FIG. 8 is a diagram illustrating a conversion operation of a code conversion unit, according to some implementations of the present disclosure.

The first ratio R1 and the second ratio R2 may match, e.g., have the same value. In some implementations, based on the fact that the first ratio R1 and the second ratio R2 are equal, the code conversion unit 150 of FIG. 2 may perform the conversion between the first ZQ code PC1 and the second to n-th ZQ codes PC2 to PCn regardless of the PVT conditions. The first ZQ code PC11 or PC21 may include a first pull-up code or a first pull-down code, and the second ZQ code PC12 or PC22 may include a second pull-up code or a second pull-down code. The calibrator 100 described with reference to FIGS. 2 to 6 may generate ZQ codes corresponding to the reference voltage VREF based on the principle described with reference to FIGS. 7A and 7B, regardless of the PVT conditions. For example, the calibrator 100 of FIG. 2 may generate a ZQ code associated with one reference voltage VREF and may generate ZQ codes corresponding to a plurality of reference voltage (VREF) levels within a shorter calibration time through the code conversion FIG. 8 is a diagram illustrating an example of converting a first ZQ code into a second ZQ code, according to some implementations of the present disclosure. Referring to FIG. 8, a first ZQ code 300, first to fifth conversion codes 301 to 305, and a second ZQ code 310 are illustrated. The first ZQ code 300 may include a first pull-up code or a first pull-down code, and the second ZQ code 310 may include a second pull-up code or a second pull-down code. A ZQ code conversion process according to some implementations of the present disclosure will be described with reference to FIGS. 2, 5, 6, and 8.

The first ZQ code 300 may be a ZQ code corresponding to the case where the reference voltage VREF is the first voltage (e.g., VDDQ/2), and the second ZQ code 310 may be a ZQ code corresponding to the case where the reference voltage VREF is the second voltage (e.g., VDDQ/3). For example, each of the first ZQ code 300 and the second ZQ code 310 may be a 6-bit binary code. The conversion ratio of the first ZQ code 300 and the second ZQ code 310, which is described with reference to FIGS. 1 to 7B, may be, for example, 0.78. Below, the process in which the code converter 200 of FIG. 6 converts the first ZQ code 300 into the second ZQ code 310 will be described based on the condition that the conversion ratio between ZQ codes is 0.78, but this is provided as an example. It should be understood that a conversion process, a conversion operation method, and a conversion ratio are not limited thereto.

Referring to FIG. 6 and FIG. 8, the converter control circuit 210 may receive the first ZQ code 300 and may generate the first conversion code 301 by padding bits to five bit positions below the LSB of the first ZQ code 300. For example, the first conversion code 301 may have a 11-bit length by padding a 5-bit binary code to a 6-bit binary code. In some implementations, five bits added below the LSB may express a decimal point or less. The first conversion code 301 may have a resolution of a 1⁄32 unit, the uppermost bit below the decimal point may have a ½ unit, and the second uppermost bit may have a ¼ unit. Below, in each of the of the conversion codes 301 to 305, a diagonally shaded portion that is a portion padded by the converter control circuit 210 may indicate decimal places.

To apply the conversion ratio of 0.78, the converter control circuit 210 may generate a plurality of conversion codes through the shift registers 220. For example, the converter control circuit 210 may provide the first conversion code 301 to the shift registers 220. The shift registers 220 may generate and store the second conversion code 302, the third conversion code 303, and the fourth conversion code 304, based on the first conversion code 301 thus received. The second conversion code 302 may be generated by shifting the first conversion code 301 to the right by one bit, the third conversion code 303 may be generated by shifting the first conversion code 301 to the right by three bits, and the fourth conversion code 304 may be generated by shifting the first conversion code 301 to the right by five bits. For example, when a value of the first conversion code 301 is “A”, a value of the second conversion code 302 may be 0.5A, a value of the third conversion code 303 may be 0.250A, and a value of the fourth conversion code 304 may be 0.03125A.

The converter control circuit 210 may provide the adders 230 with the second to fourth conversion codes 302 to 304 stored in the shift registers 220. For example, the adders 230 may add the second conversion code 302, the third conversion code 303, and the fourth conversion code 304. The adders 230 may add the second to fourth conversion codes 302 to 304 to generate the fifth conversion code 305. A value of the fifth conversion code 305 generated through the adders 230 may be 0.78125A.

The converter control circuit 210 may generate the second ZQ code 310 by rounding the fifth conversion code 305. In some implementations, the converter control circuit 210 may determine whether to round, based on a value of the uppermost bit 305_R below the decimal point of the fifth conversion code 305. For example, when the value of the uppermost bit 305_R below the decimal point is logic “0”, the converter control circuit 210 may output bits above the decimal point as the second ZQ code 310; when the value of the uppermost bit 305_R below the decimal point is logic “1”, the converter control circuit 210 may output a value obtained by adding “1” to the bits above the decimal point as the second ZQ code 310. Referring to FIG. 8, because the value of the uppermost bit 305_R below the decimal point of the fifth conversion code 305 is logic “0”, the converter control circuit 210 may output a value above the decimal point of the fifth conversion code 305 as the second ZQ code 310.

Figure 9:
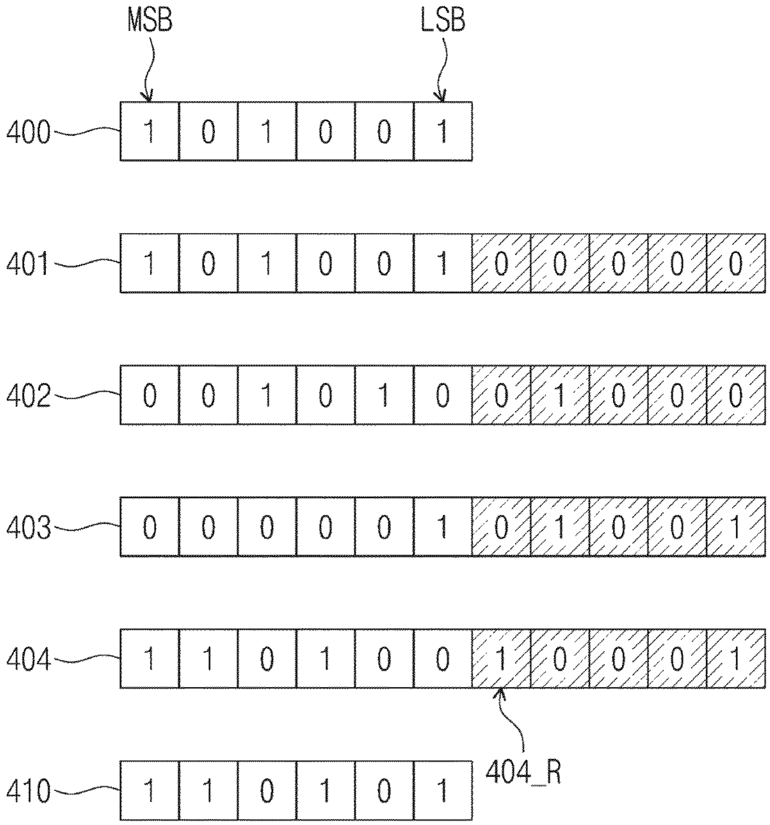
FIG. 9 is a diagram illustrating a conversion operation of a code conversion unit, according to some implementations of the present disclosure.

FIG. 9 is a diagram illustrating a case in which the code conversion process of FIG. 8 is reversed. For example, the process of generating a second ZQ code 410 corresponding to the first ZQ code 300 of FIG. 1 after obtaining the second ZQ code 310 of FIG. 8 as a first ZQ code 400 through the calibrator 100 of FIG. 2 is illustrated. Referring to FIG. 9, the first ZQ code 400, first to fourth conversion codes 401 to 404, and the second ZQ code 410 are illustrated. A ZQ code conversion process according to some implementations of the present disclosure is described with reference to FIGS. 2, 5, 6, and 9.

Referring to FIGS. 6 and 9 together, like FIG. 8, the converter control circuit 210 may generate the first conversion code 401 from the first ZQ code 400 by padding bits to bit positions below the decimal point. The converter control circuit 210 may generate the second conversion code 402 and the third conversion code 403 through the shift registers 220, based on the first conversion code 401. The second conversion code 402 may be generated by shifting the first conversion code 401 to the right by two bits, and the third conversion code 403 may be generated by shifting the first conversion code 401 to the right by five bits. For example, when a value of the first conversion code 401 is “B”, a value of the second conversion code 402 may be 0.25B, and a value of the third conversion code 403 may be 0.03125B.

The converter control circuit 210 may add the first to third conversion codes 401 to 403 to generate the fourth conversion code 404. A value of the fourth conversion code 404 may be 1.28125B. As described with respect to FIG. 8, the converter control circuit 210 may generate the second ZQ code 410 by rounding the fourth conversion code 404. In some implementations, the converter control circuit 210 may determine whether to round, based on a value of the uppermost bit 404_R below the decimal point of the fourth conversion code 404. Because the value of the uppermost bit 404_R below the decimal point of the fourth conversion code 404 is logic “1”, the converter control circuit 210 may output the rounded result as the second ZQ code 410.

Referring to FIGS. 8 and 9 together, the first ZQ code 300 of FIG. 8 may correspond to the second ZQ code 410 of FIG. 9, and the second ZQ code 310 of FIG. 8 may correspond to the first ZQ code 400 of FIG. 9. For example, according to some implementations of the present disclosure, as described above, the code conversion unit 150 of FIG. 2 may generate ZQ codes corresponding to a plurality of voltage levels of the reference voltage VREF, based on a ZQ code associated with an arbitrary voltage level of the reference voltage VREF. Also, the converter control circuit 210 may control the operations described with reference to FIGS. 8 and 9. The converter control circuit 210 may control the shift registers 220 and the adders 230 for the purpose of generating ZQ codes corresponding to various voltage levels of the reference voltage VREF.

Figure 10:
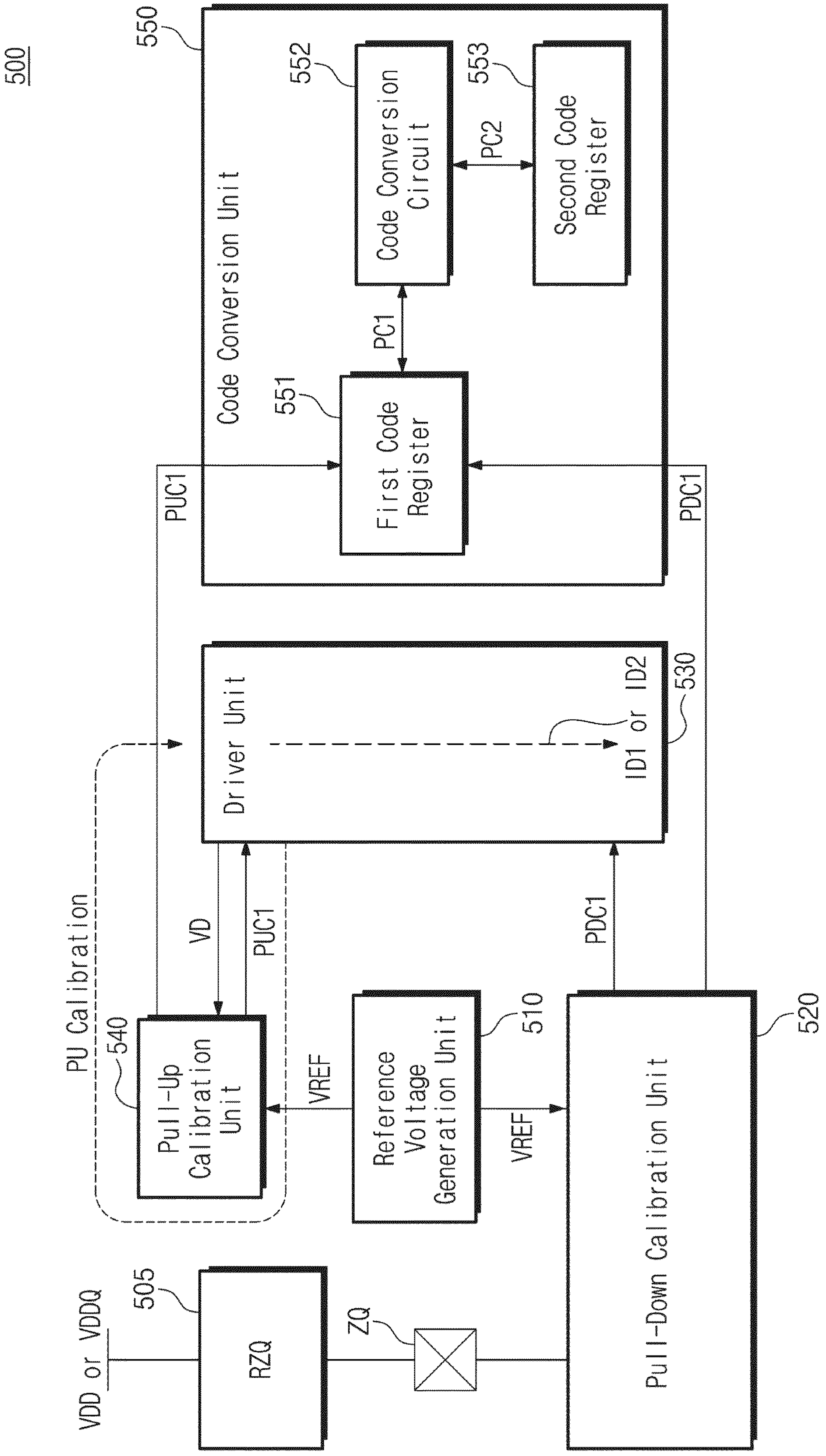
FIG. 10 is a block diagram illustrating a calibrator according to some implementations of the present disclosure.

FIG. 10 is a block diagram illustrating a calibrator according to some implementations of the present disclosure. A calibrator 500 of FIG. 10 may correspond to the calibrator 100 of FIG. 2. Elements and units of FIG. 10 can have characteristics as described for the corresponding elements and units of FIG. 2, except where noted otherwise. Referring to FIG. 10, the calibrator 500 may include a reference voltage generation unit (e.g., circuit) 510, a pull-down calibration unit (e.g., circuit) 520, a driver unit (e.g., circuit) 530, a pull-up calibration unit (e.g., circuit) 540, and a code conversion unit (e.g., circuit) 550, and the code conversion unit 550 may include a first code register 551, a code conversion circuit 552, and a second code register 553. Through the pull-down calibration unit 520, the calibrator 500 may generate the first pull-down code PDC1 corresponding to the case where the reference voltage VREF is the first voltage.

Through the driver unit 530 and the pull-up calibration unit 540, the calibrator 500 may generate the first pull-up code PUC1 corresponding to the case where the reference voltage VREF is the first voltage. The calibrator 500 may convert the first ZQ code PC1 into the second ZQ code PC2 through the code conversion unit 550, the first ZQ code PC1 may include the first pull-up code PUC1 and the first pull-down code PDC1, and the second ZQ code PC2 may include a second pull-up code and a second pull-down code.

The reference voltage generation unit 510 may correspond to the reference voltage generation unit 110 of FIG. 2. In some implementations, the reference voltage generation unit 510 may generate an arbitrary voltage between the power supply voltage (e.g., VDD or VDDQ) and the ground voltage (e.g., VSS, VSSQ, or 0 V). The code conversion unit 550 may correspond to the code conversion unit 150 of FIG. 2. The code conversion unit 550 may be the same as or similar to the code conversion unit 150 described with reference to FIGS. 2 and 6 to 9.

The pull-down calibration unit 520 may perform the pull-down calibration. The pull-down calibration may refer to an operation for providing impedance matching necessary for the operation of the pull-down driver PDD of FIG. 4. The pull-down calibration unit 520 may be connected to the ZQ pad ZQ, and a ZQ resistor 505 may be connected between the ZQ pad ZQ and the power node. A resistance value of the ZQ resistor 505 may be determined by the specification of the memory system 1000 of FIG. 1.

The pull-down calibration unit 520 may perform the pull-down calibration operation based on the voltage level of the ZQ pad ZQ (or the output voltage level VD of the driver unit 530) and the reference voltage VERF. In some implementations, the pull-down calibration unit 520 may provide the driver unit 530 or the code conversion unit 550 with the first pull-down code PDC1 generated through the calibration operation. The pull-down code may refer to a code which is provided to a pull-down calibration circuit (e.g., the pull-down calibration circuit 134 of FIG. 4) for impedance matching of the pull-down driver PDD of FIG. 4. In some implementations, the pull-down calibration unit 520 may be similar in structure to the pull-up calibration unit 120 of FIG. 3.

The driver unit 530 may correspond to the driver unit 130 of FIG. 1 and may be the same as or similar to the driver unit 130 described with reference to FIGS. 1 and 4. In some implementations, the driver unit 530 may include a pull-up driver or a pull-down driver. The driver unit 530 may receive a pull-up code or a pull-down code from the pull-down calibration unit 520 or the pull-up calibration unit 540. The driver unit 530 may provide the output voltage level VD of the output terminal to the pull-up calibration unit 540.

The pull-up calibration unit 540 may perform the pull-up calibration operation. The pull-up calibration may refer to an operation for providing impedance matching necessary for the operation of the pull-up driver PUD of FIG. 4. In some implementations, the pull-up calibration unit 540 may be connected to the driver unit 530 and the reference voltage generation unit 510. The pull-up calibration unit 540 may receive the output voltage level VD of the driver unit 530 (e.g., the voltage level of the output terminal of the driver unit 530) and the reference voltage VREF and may generate the pull-up code based on the output voltage level VD and the reference voltage VREF thus received. The pull-up code may refer to a code which is provided to a pull-up calibration circuit (e.g., the pull-up calibration circuit 132 of FIG. 4) for impedance matching of the pull-up driver.

The pull-up calibration unit 540 may perform the pull-up calibration operation by receiving the output voltage level VD from the driver unit 530 and providing the first pull-up code PUC1 to the driver unit 530. The pull-up calibration unit 540 may generate the first pull-up code PUC1 based on the pull-up calibration operation. In some implementations, the pull-up calibration unit 540 may provide the code conversion unit 550 with the first pull-up code PUC1 thus generated. In some implementations, the pull-up calibration unit 540 may be similar in structure to the pull-down calibration unit 140 of FIG. 5.

The first ZQ code PC1 and the second ZQ code PC2 described with reference to FIG. 10 may correspond to the first ZQ code PC1 and the second ZQ code PC2 described with reference to FIGS. 2 to 9. Also, implementations in which the calibrator 500 of FIG. 10 converts the first ZQ code PC1 into the second ZQ code PC2 are described, but the present disclosure is not limited thereto. For example, it should be understood that implementations in which the calibrator 500 is capable of generating ZQ codes corresponding to various voltage levels of the reference voltage VREF are also within the scope of this disclosure.

Figure 11:
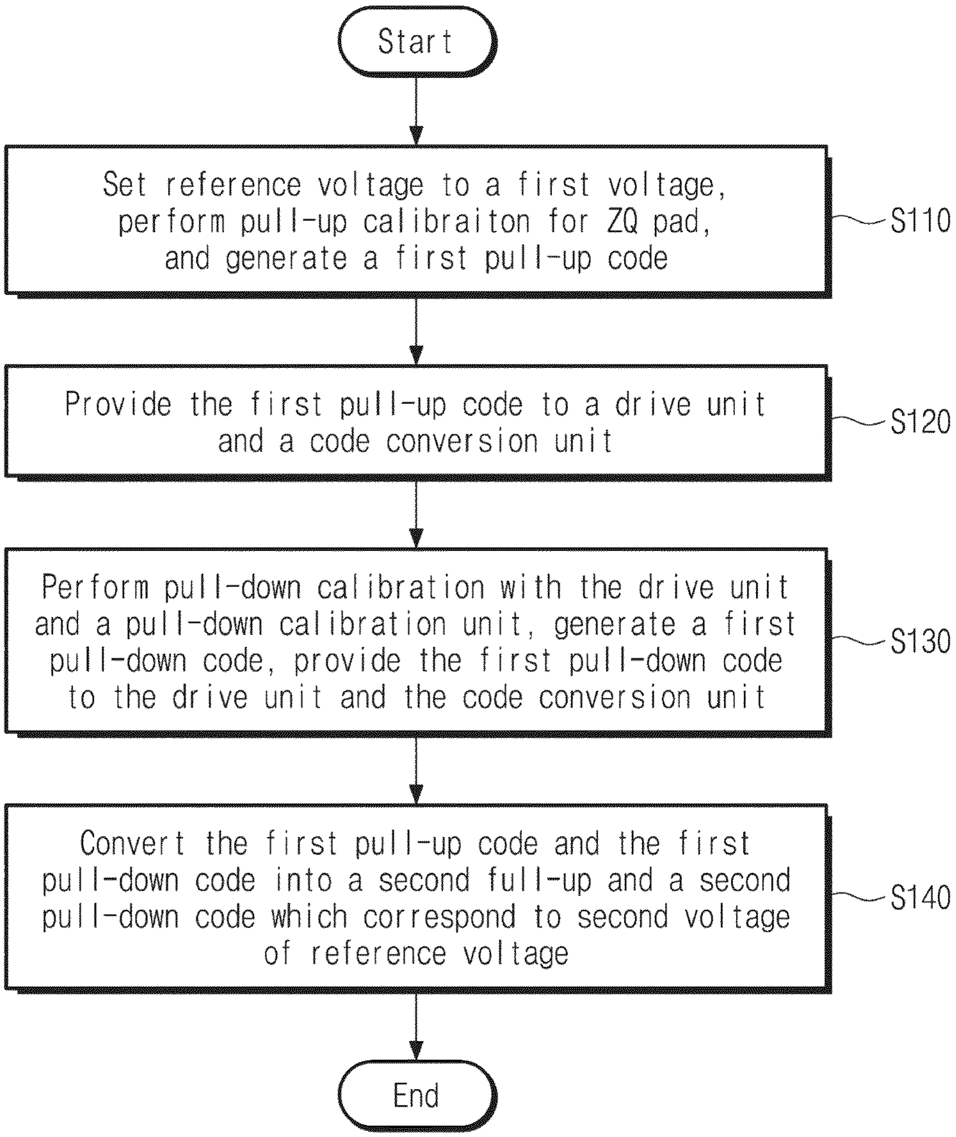
FIG. 11 is a flowchart illustrating an operation method of a calibrator, according to some implementations of the present disclosure.

FIG. 11 is a flowchart illustrating an operation method of a calibrator, e.g., the calibrator 100 described with reference to FIGS. 2 to 9, according to some implementations of the present disclosure. The operation method of the calibrator 100 of FIG. 2 according to some implementations of the present disclosure will be described with reference to FIGS. 2 to 9 and 11.

In operation S110, the calibrator 100 may set the reference voltage VREF to the first voltage, may perform the pull-up (PU) calibration with respect to the ZQ pad ZQ, and may generate a first pull-up code. For example, the calibrator 100 may generate the first pull-up code by performing the pull-up calibration through the pull-up calibration unit 120.

In operation S120, the calibrator 100 may provide the driver unit 130 and the code conversion unit 150 with the first pull-up code thus generated. For example, the calibrator 100 may provide the first pull-up code to the pull-up calibration circuit 132 of the driver unit 130 through the pull-up control circuit 122.

In operation S130, the calibrator 100 may perform the pull-down calibration and may provide the driver unit 130 and the code conversion unit 150 with the first pull-down code thus generated. For example, the calibrator 100 may perform the pull-down calibration through the driver unit 130 and the pull-down calibration unit 140, may generate the first pull-down code, and may provide the driver unit 130 and the code conversion unit 150 with the first pull-down code thus generated.

In operation S140, based on the first pull-up code and the first pull-down code, the calibrator 100 may generate a second pull-up code and a second pull-down code corresponding to the case where the reference voltage VREF is the second voltage. For example, through the code conversion unit 150, the calibrator 100 may convert the first pull-up code and the first pull-down code into the second pull-up code and the second pull-down code, respectively. For example, as described with reference to FIGS. 2 to 9, the calibrator 100 may perform the conversion based on a ratio of a current of the driver unit 130 when the reference voltage VREF corresponds to the first voltage and a current of the driver unit 130 when the reference voltage VREF corresponds to the second voltage, or a ratio of a resistance value of the pull-up or pull-down calibration circuit when the reference voltage VREF corresponds to the first voltage and a resistance value of the pull-up or pull-down calibration circuit when the reference voltage VREF corresponds to the second voltage.

Figure 12:
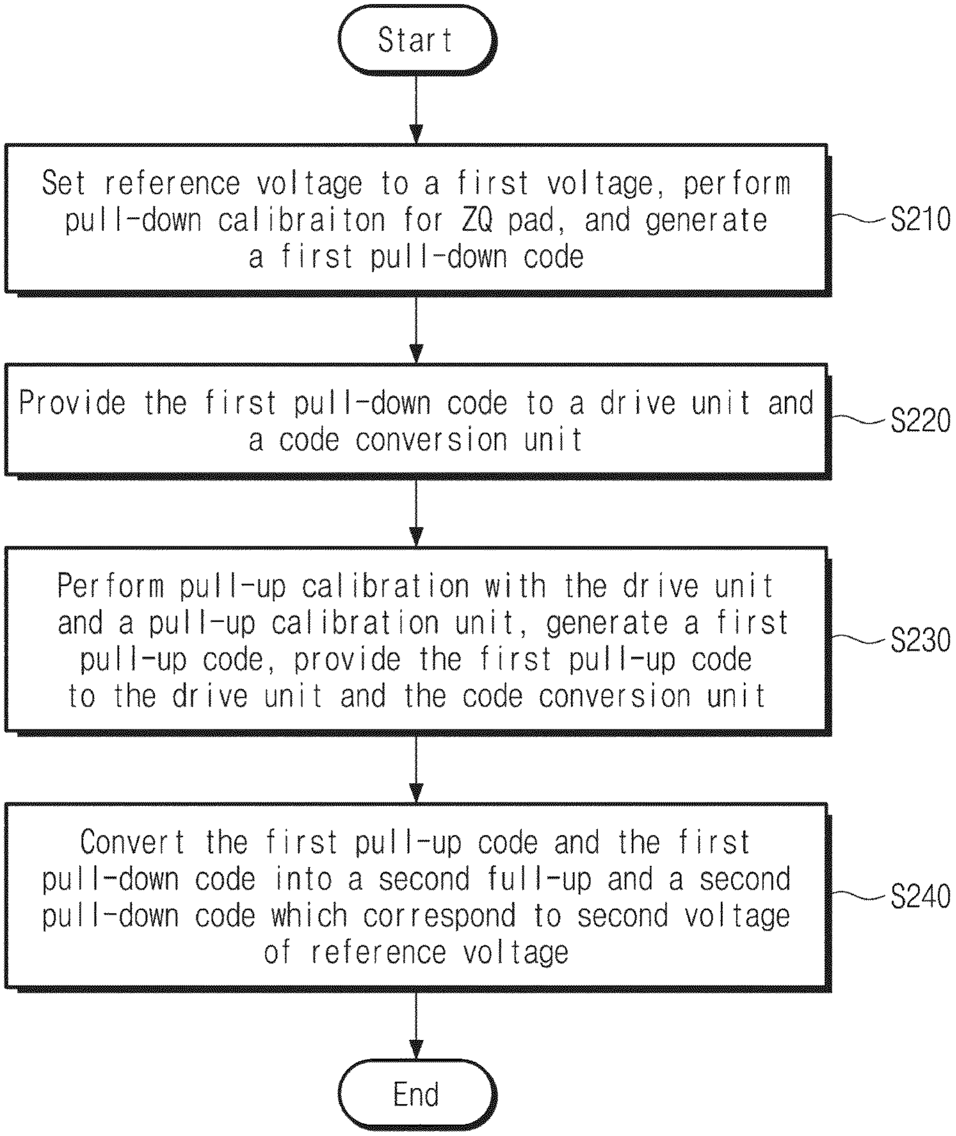
FIG. 12 is a flowchart illustrating an operation method of a calibrator, according to some implementations of the present disclosure.

FIG. 12 is a flowchart illustrating an operation method of a calibrator, e.g., the calibrator 500, according to some implementations of the present disclosure. The operation method of the calibrator 500 according to some implementations of the present disclosure will be described with reference to FIGS. 3 to 10 and 12.

In operation S210, the calibrator 500 may set the reference voltage VREF to the first voltage, may perform the pull-down (PD) calibration with respect to the ZQ pad ZQ, and may generate a first pull-down code. For example, the calibrator 500 may generate the first pull-down code by performing the pull-down calibration through the pull-down calibration unit 520.

In operation S220, the calibrator 500 may provide the driver unit 530 and the code conversion unit 550 with the first pull-down code thus generated. For example, through the pull-down control circuit, the calibrator 500 may provide a pull-down calibration circuit (e.g., the pull-down calibration circuit 134 of FIG. 4) of the driver unit 530 with the first pull-down code thus generated.

In operation S230, the calibrator 500 may perform the pull-up calibration and may provide the driver unit 530 and the code conversion unit 550 with a generated pull-up code. For example, the calibrator 500 may perform the pull-up calibration through the driver unit 530 and the pull-up calibration unit 540, may generate a first pull-up code, and may provide the driver unit 530 and the code conversion unit 550 with the first pull-up code thus generated.

In operation S240, based on the first pull-up code and the first pull-down code, the calibrator 500 may generate a second pull-up code and a second pull-down code corresponding to the case where the reference voltage VREF is the second voltage. For example, through the code conversion unit 550, the calibrator 500 may convert the first pull-up code and the first pull-down code into the second pull-up code and the second pull-down code, respectively. For example, as described with reference to FIGS. 3 to 10, the calibrator 500 may perform the conversion based on a ratio of a current of the driver unit 530 when the reference voltage VREF corresponds to the first voltage and a current of the driver unit 130 when the reference voltage VREF corresponds to the second voltage, or a ratio of a resistance value of the pull-up or pull-down calibration circuit when the reference voltage VREF corresponds to the first voltage and a resistance value of the pull-up or pull-down calibration circuit when the reference voltage VREF corresponds to the second voltage.

Figure 13:
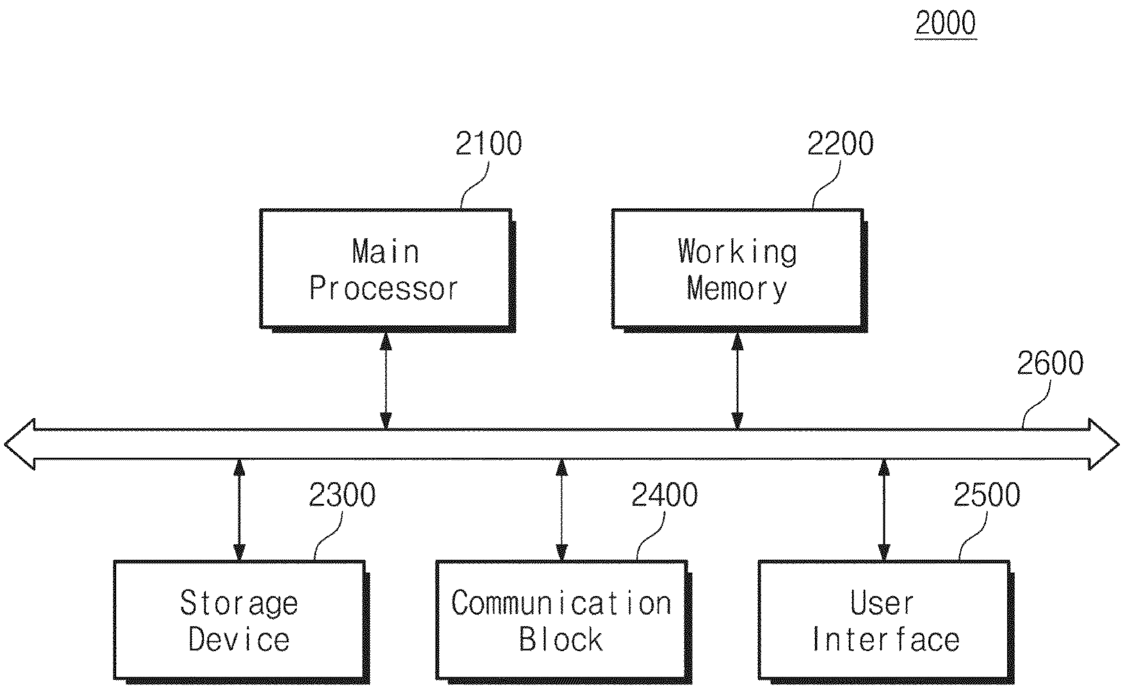
FIG. 13 is a block diagram illustrating an electronic system, according to some implementations of the present disclosure.

FIG. 13 is a block diagram illustrating a configuration of an electronic system according to some implementations. An electronic system 2000 may include a main processor 2100, a working memory 2200, a storage device 2300, a communication block 2400, a user interface 2500, and a bus 2600. For example, the electronic system 2000 may be an electronic device such as a desktop computer, a laptop computer, a tablet computer, a smartphone, a wearable device, a video game console, a workstation, and a server.

The main processor 2100 may control all operations of the electronic system 2000. The main processor 2100 may perform various kinds of arithmetic operations and/or logic operations. To this end, the main processor 2100 may include a special-purpose circuit (e.g., a FPGA (Field Programmable Gate Array) or an ASICs (Application Specific Integrated Circuits)). For example, the main processor 2100 may include one or more processor cores and may be implemented with a general-purpose processor, a special-purpose processor, or an application processor.

The working memory 2200 may store data which are used in the operation of the electronic system 2000. For example, the working memory 2200 may temporarily store data processed or to be processed by the main processor 2100.

For example, the working memory 2200 may include a volatile memory such as a dynamic RAM (DRAM) or a synchronous DRAM (SDRAM) and/or a non-volatile memory such as a phase-change RAM (PRAM), a magneto-resistive RAM (MRAM), a resistive RAM (ReRAM), or a ferroelectric RAM (FRAM).

The storage device 2300 may include a memory device and a controller. The memory device of the storage device 2300 may store data regardless of whether a power is supplied. For example, the storage device 2300 may include a non-volatile memory such as a flash memory, a PRAM, an MRAM, a ReRAM, or a FRAM. For example, the storage device 2300 may include a storage medium such as a solid state drive (SSD), an embedded multimedia card (eMMC), or a universal flash storage (UFS). The controller may control the memory device such that the memory device stores or outputs data.

The communication block 2400 may communicate with an external device/system of the electronic system 2000. For example, the communication block 2400 may support at least one of various wireless communication protocols such as long term evolution (LTE), worldwide interoperability for microwave access (WIMAX), global system for mobile communications (GSM), code division multiple access (CDMA), bluetooth, near field communication (NFC), wireless fidelity (Wi-Fi) and radio frequency identification (RFID) and/or at least one of various wired communication protocols such as transfer control protocol/internet protocol (TCP/IP), a universal serial bus (USB), and Firewire.

The user interface 2500 may arbitrate the communication between the user and the electronic system 2000. For example, the user interface 2500 may include an input interface such as a keyboard, a mouse, a keypad, a button, a touch panel, a touch screen, a touch pad, a touch ball, a camera, a microphone, a gyroscope sensor, or a vibration sensor. For example, the user interface 2500 may include an output interface such as a liquid crystal display (LCD) device, a light emitting diode (LED) display device, an organic LED (OLED) display device, an active matrix OLED (AMOLED) display device, a speaker, or a motor.

The bus 2600 may provide a communication path between the components of the electronic system 2000. The components of the electronic system 2000 may exchange data with each other based on the bus format of the bus 2600. For example, the bus format may include at least one or more of various interface protocols such as USB, small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), enhanced IDE (EIDE), non-volatile memory express (NVMe), and universal flash storage (UFS).

Like the memory system 1000 of FIG. 1, the storage device 2300 may include a controller and a memory device. An interface operation between the controller and the memory device, which is performed in the storage device 2300, may be implemented based on the implementations of the present disclosure described with reference to FIGS. 2 to 12. In addition, an interface operation between components in the electronic system 2000 may be performed based on the implementations of the present disclosure described with reference to FIGS. 2 to 12. For example, an interface operation for the main processor 2100 to control the user interface 2500 may be implemented based on the implementations of the present disclosure described with reference to FIGS. 2 to 12.

Figure 14:
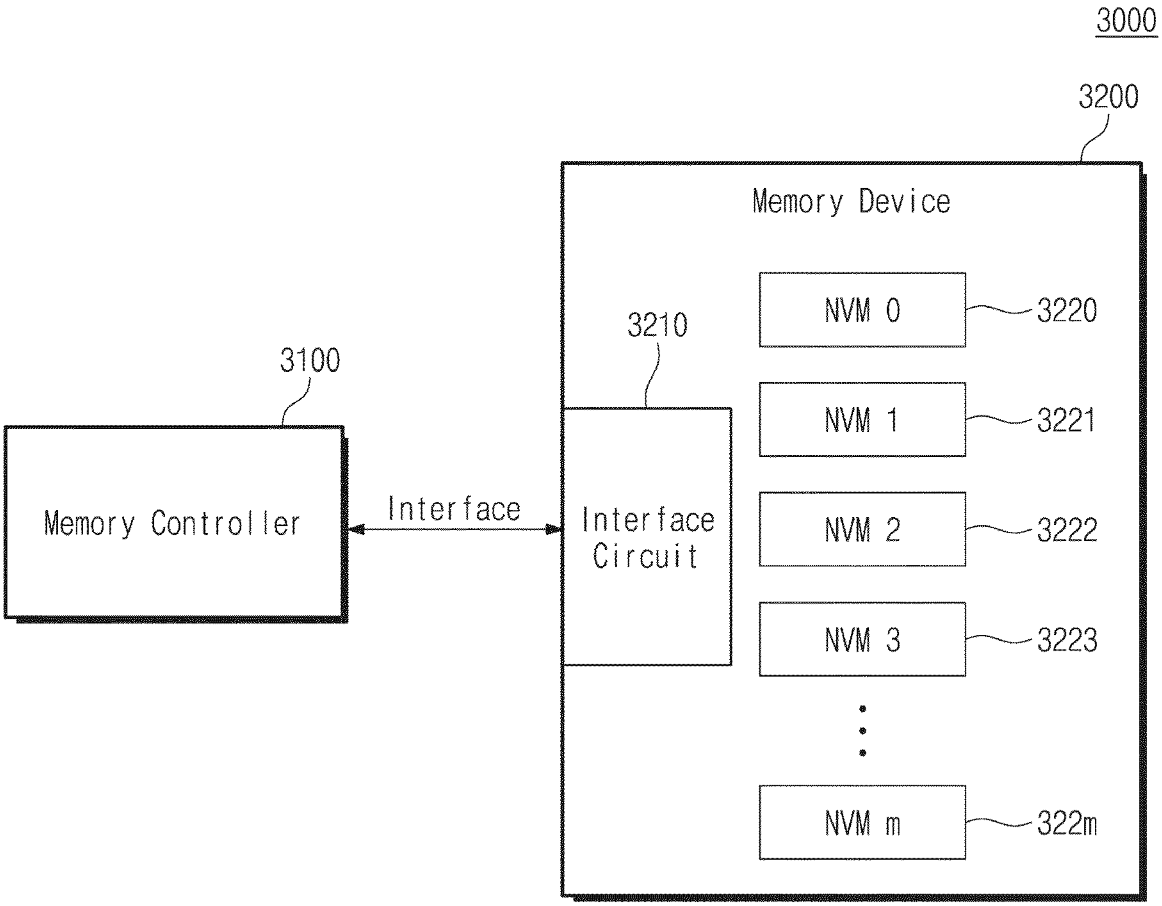
FIG. 14 is a block diagram illustrating a memory system, according to some implementations of the present disclosure.

FIG. 14 is a block diagram illustrating a memory system, according to some implementations of the present disclosure. Referring to FIG. 14, a memory system 3000 may include a memory controller 3100 and a memory device 3200. The memory device 3200 may include an interface circuit 3210 and a plurality of non-volatile memories (NVMs) 3220 to 322*m*.

The memory controller 3100 may control the memory device 3200. In some implementations, the memory controller 3100 may control the memory device 3200 based on an interface operation with the memory device 3200. For example, the memory controller 3100 may transmit a command to the memory device 3200 based on the interface operation. As another example, based on the interface operation, the memory controller 3100 may transmit data to be written in the memory device 3200 or may receive data read from the memory device 3200.

Based on the interface operation, the memory controller 3100 may transmit an address of data which are to be written in or read from the memory device 3200. The memory controller 3100 may include the calibrator described with reference to FIGS. 2 to 12. In some implementations, the memory controller 3100 may be the same as or similar to the controller 1100 illustrated in FIG. 1.

Under control of the memory controller 3100, the memory device 3200 may store data or may read the stored data so as to be provided to the memory controller 3100. The memory device 3200 may include an additional interface circuit 3210 between the memory controller 3100 and the plurality of NVMs 3220 to 322*m*. The memory device 3200 may be included in one package. In some implementations, the memory device 3200 may include a plurality of dies included in one package, and the plurality of dies may include the interface circuit 3210 and the plurality of NVMs 3220 to 322*m*. For example, a first die (not illustrated) included in the memory device 3200 may include the interface circuit 3210, and a second die (not illustrated) included in the memory device 3200 may include the first NVM 3221 and the second NVM 3222. The above description is provided as an example, and the present disclosure is not limited thereto. It should be understood that implementations in which the interface circuit 3210 or the NVMs 3220 to 322*m* are disposed in an arbitrary number of dies based on an arbitrary number, or a combination, or implementations in which a die including the interface circuit 3210 includes some NVMs, the number of which is arbitrarily selected, from among the NVMs 3220 to 322*m*, are also within the scope of this disclosure.

The interface circuit 3210 may control the plurality of NVMs 3220 to 322*m* under control of the memory controller 3100. For example, the interface circuit 3210 may include a frequency boosting interface (FBI) or may be the FBI. In some implementations, the interface circuit 3210 may control some NVMs, the number of which is arbitrarily selected, from among the NVMs 3220 to 322*m*. For example, the interface circuit 3210 may control the 0-th to seventh NVMs 3220 to 3227. The interface circuit 3210 may include the calibrator described with reference to FIGS. 2 to 12.

The plurality of NVMs 3220 to 322*m* may store data. In some implementations, at least one or more of the plurality of NVMs 3220 to 322*m* may include the calibrator described with reference to FIGS. 2 to 12. For example, the 0-th NVM 3220 may perform the interface operation with the interface circuit 3210 based on the ZQ calibration operation of the calibrator described with reference to FIGS. 2 to 12. In some implementations, the NVMs 3220 to 322*m* may include at least one or more kinds of non-volatile memories. For example, the NVMs 3220 to 322*m* may include a NAND flash memory or a 3D NAND flash memory.

In some implementations, the number of output voltage levels of the driver included in the interface circuit 3210 of the memory system 3000 or the number of output voltage levels of the driver included in the memory controller 3100 may be two or more. For example, the driver included in the memory system 3000 may have a first reference voltage as the output voltage level or may have a second reference voltage as the output voltage level, and the first reference voltage and the second reference voltage may be voltages between the power supply voltage and the ground voltage. The memory system 3000 may perform calibration (e.g., ZQ calibration) corresponding to a plurality of voltages within a shorter time than a conventional memory system, based on the calibrator according to the implementations of the present disclosure described with reference to FIGS. 2 to 12. The reason is that a time necessary to generate ZQ codes respectively corresponding to the first reference voltage and the second reference voltage is longer than a time necessary to generate a second ZQ code corresponding to the second reference voltage based on a first ZQ code corresponding to the first reference voltage, according to some implementations of the present disclosure.

According to the present disclosure, a ZQ calibration device capable of generating ZQ codes corresponding to various voltage levels and quickly generating ZQ codes corresponding to various voltage levels based on a ZQ code of one voltage level, and operation methods thereof, are provided.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:

a driver circuit including a pull-up driver and a pull-down driver;

a ZQ calibration circuit configured to perform ZQ calibration with respect to the driver circuit based on a resistance value and a first reference voltage, and generate a first ZQ code corresponding to the first reference voltage based on the ZQ calibration; and a code conversion circuit configured to:

based on the first ZQ code, generate a second ZQ code corresponding to a second reference voltage different from the first reference voltage, and based on the first ZQ code, generate a third ZQ code corresponding to a third reference voltage different from the first reference voltage and the second reference voltage, wherein the first reference voltage, the second reference voltage, and the third reference voltage are in a range between a power supply voltage of the memory device and a ground voltage.

2. The memory device of claim 1, wherein the code conversion circuit is configured to generate the second ZQ code based on a ratio of a first current level of the driver circuit and a second current level of the driver circuit, wherein the first current level is a current level of the driver circuit when an output voltage of the driver circuit is the first reference voltage, and wherein the second current level is a current level of the driver circuit when the output voltage of the driver circuit is the second reference voltage.

3. The memory device of claim 1, wherein the first ZQ code and the second ZQ code are binary codes with the same number of digits.

4. The memory device of claim 1, wherein the code conversion circuit is configured to generate the second ZQ code using a look-up table.

5. The memory device of claim 1, wherein a first pull-up code for impedance matching of the pull-up driver is included in the first ZQ code, wherein the memory device comprises a pull-up calibration unit configured to generate the first pull-up code, wherein the resistance value is a value of a resistor, wherein the pull-up calibration unit includes:

a first comparator configured to compare (i) a voltage level of a ZQ node connected to the resistor and (ii) the first reference voltage, to generate a first comparison output;

a pull-up control circuit configured to generate a pull-up control signal based on the first comparison output; and a pull-up calibration circuit configured to generate a pull-up signal in response to the pull-up control signal and to provide the pull-up signal to the ZQ node, and wherein the first pull-up code is a pull-up control signal corresponding to a case where the voltage level of the ZQ node matches the first reference voltage.

6. The memory device of claim 1, wherein a first pull-down code for impedance matching of the pull-down driver is included in the first ZQ code, wherein the memory device comprises a pull-down calibration circuit, wherein the pull-down calibration circuit and the driver circuit are configured to generate the first pull-down code, wherein the resistance value is a value of a resistor, wherein the pull-down calibration circuit includes:

a second comparator configured to compare (i) an output voltage level of an output terminal of the driver circuit and (ii) the first reference voltage, to generate a second comparison output; and a pull-down control circuit configured to generate a pull-down control signal based on the second comparison output and to provide the pull-down control signal to the driver circuit, and wherein the first pull-down code is a pull-down control signal corresponding to a case where the output voltage level matches the first reference voltage.

7. The memory device of claim 1, wherein the pull-up driver is configured to operate in response to a pull-up signal and is connected between a power node and a driving node transferring an output of the driver circuit, wherein the pull-down driver is configured to operate in response to a pull-down signal and is connected between a ground node and the driving node, and wherein the driver circuit further includes:

a pull-up calibration circuit connected between the power node and the driving node, the pull-up calibration circuit configured to provide impedance matching of the pull-up driver; and a pull-down calibration circuit connected between the ground node and the driving node, the pull-down calibration circuit configured to provide impedance matching of the pull-down driver.

8. The memory device of claim 1, wherein the first ZQ code and the second ZQ code are binary codes with the same number of digits, wherein the code conversion circuit includes a code converter, wherein the code converter includes:

a converter control circuit configured to control the generation of the second ZQ code based on the first ZQ code and to generate a first modified code by padding the first ZQ code;

shift registers configured to generate second modified codes by performing bit shifting with respect to the first modified code; and adders configured to generate a third modified code by adding the second modified codes, and wherein the code conversion circuit is configured to generate the second ZQ code based on the third modified code.

9. The memory device of claim 8, wherein each of the first modified code, the second modified codes, and the third modified code includes first bits corresponding to a value below a decimal point, based on the padding, and wherein the second ZQ code is generated by performing rounding based on an uppermost bit of the first bits of the third modified code.

10. The memory device of claim 8, wherein the code conversion circuit further includes:

a first code register configured to store the first ZQ code and to provide the first ZQ code to the code converter; and a second code register configured to receive and store the second ZQ code generated from the code converter.

11. The memory device of claim 10, further comprising:

a ZQ code management register configured to manage a plurality of ZQ codes, wherein the ZQ code management register is configured to:

receive the first ZQ code from the first code register;

receive the second ZQ code from the second code register; and provide the first ZQ code or the second ZQ code to the driver circuit.

12. The memory device of claim 10, wherein the first code register is further configured to provide the first ZQ code to the driver circuit, and wherein the second code register is further configured to provide the second ZQ code to the driver circuit.

13. A calibration method of a memory device, the method comprising:

performing ZQ calibration with respect to a driver circuit included in the memory device based on a resistance value and a first reference voltage, to generate a first ZQ code corresponding to the first reference voltage;

generating a second ZQ code corresponding to a second reference voltage different from the first reference voltage based on conversion of the first ZQ code; and based on the first ZQ code, generating a third ZQ code corresponding to a third reference voltage different from the first reference voltage and the second reference voltage, wherein the first reference voltage, the second reference voltage, and the third reference voltage are in a range between a power supply voltage and a ground voltage.

14. The method of claim 13, wherein the first ZQ code includes a first pull-up code, wherein performing the ZQ calibration comprises:

generating a first comparison output as a result of comparing (i) a first voltage level of a first node connected to a resistor having the resistance value and (ii) the first reference voltage;

generating a pull-up control signal based on the first comparison output; and providing a pull-up signal to the first node in response to the pull-up control signal, and wherein the first pull-up code is generated based on the first voltage level matching the first reference voltage.

15. The method of claim 13, wherein the first ZQ code includes a first pull-down code, wherein performing the ZQ calibration comprises:

generating a second comparison output based on comparing (i) a second voltage level of an output terminal of the driver circuit and (ii) the first reference voltage;

generating a pull-down control signal based on the second comparison output; and changing the second voltage level in response to the pull-down control signal, and wherein the first pull-down code is generated based on the second voltage level matching the first reference voltage.

16. The method of claim 13, wherein generating the second ZQ code is based on a ratio of a first current level of the driver circuit and a second current level of the driver circuit, wherein the first current level is a current level of the driver circuit when an output voltage level of the driver circuit is the first reference voltage, and wherein the second current level is a current level of the driver circuit when the output voltage level of the driver circuit is the second reference voltage.

17. The method of claim 13, wherein the second ZQ code is generated by a code conversion circuit included in the memory device.

18. The method of claim 13, wherein the generating the second ZQ code is performed using a look-up table.

19. An electronic system comprising:

a main processor configured to control the electronic system; and a storage device configured to store data, wherein the storage device includes a calibration circuit configured to:

generate a first ZQ code corresponding to a first reference voltage based on a resistance value and the first reference voltage, generate a second ZQ code corresponding to a second reference voltage based on the first ZQ code, and based on the first ZQ code, generate a third ZQ code corresponding to a third reference voltage different from the first reference voltage and the second reference voltage, wherein the first reference voltage, the second reference voltage, and the third reference voltage are in a range between a power supply voltage and a ground voltage.

20. The electronic system of claim 19, wherein the storage device further includes a driver circuit, wherein the second ZQ code is generated based on a ratio of a first current level of the driver circuit and a second current level of the driver circuit, wherein the first current level is a current level of the driver circuit when an output voltage level of the driver circuit is the first reference voltage, and wherein the second current level is a current level of the driver circuit when the output voltage level of the driver circuit is the second reference voltage.

* * * * *